United States Patent
Takahashi

(10) Patent No.: US 7,847,702 B2
(45) Date of Patent: Dec. 7, 2010

(54) POWER SUPPLY CONTROLLER

(75) Inventor: Seiji Takahashi, Yokkaichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

(*) Notice: Subject to any disclaimer, the term of this patent is extended or adjusted under 35 U.S.C. 154(b) by 701 days.

(21) Appl. No.: 11/822,389

(22) Filed: Jul. 5, 2007

(65) Prior Publication Data

US 2008/0048877 A1   Feb. 28, 2008

(30) Foreign Application Priority Data

Jul. 11, 2006   (JP) .............................. 2006-190703

(51) Int. Cl.
*G08B 21/00* (2006.01)
(52) U.S. Cl. .................. 340/653; 340/650; 324/509
(58) Field of Classification Search .............. 340/650, 340/653, 635, 636.11, 636.12, 636.13, 636.15, 340/636.17, 657–664; 324/509–511
See application file for complete search history.

(56) References Cited

U.S. PATENT DOCUMENTS

| | | | | |
|---|---|---|---|---|
| 5,796,278 A | * | 8/1998 | Osborn et al. | 327/108 |
| 6,204,768 B1 | * | 3/2001 | Kosugi et al. | 340/577 |
| 6,967,487 B2 | * | 11/2005 | Garnett | 324/537 |
| 7,177,130 B2 | * | 2/2007 | Ohshima | 361/93.9 |
| 7,545,127 B2 | * | 6/2009 | Takahashi et al. | 323/276 |

FOREIGN PATENT DOCUMENTS

JP    A 2001-217696    8/2001

* cited by examiner

*Primary Examiner*—George A Bugg
*Assistant Examiner*—Edny Labbees
(74) *Attorney, Agent, or Firm*—Oliff & Berridge, PLC

(57) ABSTRACT

A power supply controller includes a semiconductor switching element disposed on a current supply line from a power source to a load. The semiconductor switching element is switched between ON and OFF for controlling power supply to the load. A short anomaly of the semiconductor switching element is determined if at least one of an input-to-output voltage of the semiconductor switching element being smaller than a first threshold and the semiconductor switching element being in an ON state is detected, when an OFF signal for instruction to turn OFF the semiconductor switching element is received.

11 Claims, 13 Drawing Sheets

FIG.6

| FC COUNTER | FC COUNTER (higher 5 bits) | THRESHOLD DESIGNATION SIGNAL |
|---|---|---|
| [FCC]<8 | 0 ≤[FRC]<1 | OCL0 |
| | 1 ≤[FRC]<2 | OCL1 |
| | 2 ≤[FRC]<4 | OCL2 |
| | 4 ≤[FRC]<8 | OCL3 |
| | 8 ≤[FRC]<32 | OCL4 |
| | [FRC]≤ 32 | OCL5 |
| [FCC]≥ 8 | — | OCL5 |

FIG.11

| STATES | S6 | Vgs | Vs | PASSAGE of CURRENT | ANOMALY DETECTION |
|---|---|---|---|---|---|
| Power MOS Short | ON | Vgs>Vt2 | Vs≈Vcc | Allowed | Unnecessary |
| | OFF | Vgs<Vt2 | Vs≈Vcc (Vds>Vt1) | Allowed | Necessary |
| Drain-Gate Short (and the other short anomalies) | ON | Vgs>Vt2 | Vs≈Vcc | Allowed | Unnecessary |
| | OFF | Vgs>Vt2 | Vs≈Vcc | Allowed | Necessary (as Overheat Anomaly) |
| | OFF | Vgs>Vt2 | Vs<Vcc (Vds>Vt1) | Allowed | Necessary |
| Electromotive Force of Motor | ON | Vgs>Vt2 | Vs≈Vcc | — | False detection as anomaly should be prevented |
| | OFF | Vgs<Vt2 | Vs<Vcc (Vds>Vt1) | Blocked | False detection as anomaly should be prevented |

FIG.13

| STATES | | S6 | Vs' | Vs | PASSAGE of CURRENT | ANOMALY DETECTION |
|---|---|---|---|---|---|---|
| Power MOS Short | | ON | Increased | Vs≈Vcc | Allowed | Unnecessary |
| | | OFF | Not Increased (Vs'<Vt3) | Vs≈Vcc (Vds<Vt1) | Allowed | Necessary |
| Drain-Gate Short (and the other short anomalies) | | ON | Increased | Vs≈Vcc | Allowed | Unnecessary |
| | | OFF | Increased (Vs'>Vt3) | Vs<Vcc | Allowed | Necessary (as Overheat Anomaly) |
| Electromotive Force of Motor | | ON | Increased | Vs≈Vcc | Allowed | Necessary |
| | | | | Vs<Vcc (Vds>Vt1) | Allowed | Necessary |
| | | ON | Increased | Vs≈Vcc | — | False detection as anomaly should be prevented |
| | | OFF | Not Increased (Vs'<Vt3) | Vs<Vcc (Vds>Vt1) | Blocked | False detection as anomaly should be prevented |

POWER SUPPLY CONTROLLER

CROSS REFERENCE TO RELATED APPLICATION

The present application claims priority from Japanese Patent Application No. 2006-190703 filed on Jul. 11, 2006. The entire content of this priority application is incorporated herein by reference.

BACKGROUND OF THE INVENTION

1. Field of the Invention

The present invention relates to a power supply controller, and particularly relates to detection of a short-circuit anomaly of a semiconductor switching element.

2. Description of the Related Art

A power supply controller is conventionally provided for controlling power supply to a load. In the power supply controller, a high-power semiconductor switching element such as a power MOSFET is disposed on a current supply line connected between a power source and the load, and the power supply to the load is controlled by switching the semiconductor switching element between ON and OFF according to external ON and OFF signals.

In such a power supply controller, it is known that a self-protective function is provided for protecting its own semiconductor switching element. The self-protective function controls the potential of the control terminal (e.g., the gate in the case of a MOSFET) of the semiconductor switching element so as to turn off the semiconductor switching element when an overcurrent (i.e., an abnormal current) has occurred on the current supply line due to short-circuiting in the load or the like.

Specifically, a current detecting resistor is serially connected to the load terminal (e.g., the source or drain in the case of a MOSFET) of the semiconductor switching element as shown in JP-A-2001-217696. The load current passing through the semiconductor switching element is detected based on the voltage between the terminals of the resistor. When the load current value is larger than a predetermined threshold, an occurrence of an overcurrent anomaly is determined, and thereby the semiconductor switching element is turned off (i.e., turned to a shutoff state).

Short-circuiting could also occur in the semiconductor switching element for some reasons. Specifically short-circuiting may occur between input and output terminals (e.g., drain and source in the case of a MOSFET), or between input and control terminals (e.g., drain and gate in the case of a MOSFET) of the semiconductor switching element. In this case, power will be supplied to the load, even when the power supply controller receives an OFF signal.

That is, if a vehicle lamp is connected as a load to the power supply controller, for example, the lamp is on at all times due to the short-circuiting. The vehicle driver may know the short-circuiting from the lamp being on at all times. However, he/she hardly finds that the lamp is on particularly in the daytime.

Further a problem arises that the self-protective function will not operate due to the short-circuiting, even when an anomaly such as an overcurrent has occurred. Therefore the short-circuiting in the semiconductor switching element should be detected and determined as a short anomaly.

SUMMARY OF THE INVENTION

A power supply controller according to the present invention includes a semiconductor switching element disposed on a current supply line from a power source to a load, and is configured to switch the semiconductor switching element between ON and OFF for controlling power supply to the load.

The power supply controller further includes a control circuit, a first determination circuit, a second determination circuit and a short detecting circuit.

The control circuit is configured to receive an ON signal and an OFF signal, and further configured to turn ON the semiconductor switching element based on reception of the ON signal and turn OFF the semiconductor switching element based on reception of the OFF signal.

The first determination circuit is configured to output a first signal if an input-to-output voltage of the semiconductor switching element is smaller than a first threshold. The second determination circuit is configured to output a second signal if the semiconductor switching element is in an ON state.

The short detecting circuit is configured to output a short anomaly signal indicating a short anomaly of the semiconductor switching element if at least one of the first signal from the first determination circuit and the second signal from the second determination circuit is outputted during reception of the OFF signal.

The first threshold can be set to a value larger than an input-to-output voltage of the semiconductor switching element when short-circuiting has occurred between the input and output terminals of the semiconductor switching element and the OFF signal is received. Further, in the case that the load is a motor, the first threshold can be set so as to be smaller than an input-to-output voltage of the semiconductor switching element when an electromotive force is generated due to the inertial rotation of the motor after the OFF signal.

According to the present invention, when short-circuiting has occurred between input and output terminals of the semiconductor switching element, the input-to-output voltage of the semiconductor switching element is larger than the first threshold, and therefore a short anomaly signal is outputted.

If short-circuiting has occurred between the input and control terminals of the semiconductor switching element, the voltage of the control terminal is pulled to the input terminal side during reception of the OFF signal, so that the semiconductor switching element is in a halfway ON state. In this case, the input-to-output voltage of the semiconductor switching element is larger than the first threshold. That is, the first determination circuit will not output the first signal.

However, according to the present invention, the short-circuiting between the input and control terminals is detected as a short anomaly based on the semiconductor switching element being in the ON state during reception of the OFF signal. That is, the second determination circuit outputs the second signal, and thereby a short anomaly signal is outputted.

When an electromotive force is generated due to the inertial rotation of a motor (as a load) after reception of the OFF signal, the input-to-output voltage of the semiconductor switching element is larger than the first threshold, and the semiconductor switching element is in the OFF state (i.e., shutoff state) due to the OFF signal. That is, a short anomaly signal is not outputted in this case.

Thus the power supply controller according to the present invention can detect a short anomaly such as short-circuiting between the input and output terminals or the input and control terminals of the semiconductor switching element, preventing false detection due to an electromotive force of the motor.

According to the present invention, the second determination circuit is preferably configured to output the second signal if the result of subtraction of an output terminal voltage of the semiconductor switching element from a control terminal voltage of the semiconductor switching element is equal to or larger than a second threshold.

Whether the semiconductor switching element is in an ON state or not can be determined based on a voltage level between the control and output terminals of the semiconductor switching element. Therefore, according to the present invention, an ON state of the semiconductor switching element is determined if the result of subtraction of an output terminal voltage from a control terminal voltage of the semiconductor switching element is equal to or larger than the second threshold.

If an electromotive force is generated due to the inertial rotation of a motor (as a load) after reception of the OFF signal, the semiconductor switching element is in the OFF state due to the OFF signal, and therefore the second determination circuit will not output the second signal. Further the input-to-output voltage of the semiconductor switching element is larger than the first threshold. That is, a short anomaly signal is not outputted in this case. Thus false detection due to the electromotive force of the motor is prevented.

Preferably, the power supply controller according to the present invention further includes a current detecting switching element. The input sides of the semiconductor switching element and the current detecting switching element are connected to each other, and the control terminals of the semiconductor switching element and the current detecting switching element are connected to each other.

The control circuit is configured to turn ON the semiconductor switching element and the current detecting switching element based on reception of the ON signal, and turn OFF the semiconductor switching element and the current detecting switching element based on reception of the OFF signal. The second determination circuit is configured to output the second signal if an output terminal voltage of the current detecting switching element is larger than a third threshold.

Some of conventional power supply controllers include a current detecting switching element for monitoring a load current passing through the semiconductor switching element. In such a power supply controller, the input sides of the semiconductor switching element and the current detecting switching element are connected to each other, and the control terminals of the semiconductor switching element and the current detecting switching element are connected to each other. The load current is monitored based on an output signal from the current detecting switching element.

In the case of such a power supply controller, according to the present invention, whether the semiconductor switching element is in an ON state or not can be determined based on an output terminal voltage of the current detecting switching element.

If an electromotive force is generated due to the inertial rotation of a motor (as a load) after reception of the OFF signal, the semiconductor switching element is in the OFF state due to the OFF signal, and therefore the output terminal voltage of the current detecting switching element is smaller than the third threshold. Further the input-to-output voltage of the semiconductor switching element is larger than the first threshold. That is, a short anomaly signal is not outputted in this case. Thus false detection due to the electromotive force of the motor is prevented.

Preferably, the power supply controller according to the present invention includes a leakage current block circuit, which is provided on a current path along which a current passes from the power source to the first determination circuit and the second determination circuit.

The leakage current block circuit is configured to block passage of the current when an output terminal voltage of the semiconductor switching element is equal to or smaller than a fourth threshold, and further configured to allow passage of the current when the output terminal voltage is larger than the fourth threshold.

For example, the fourth threshold can be set to a value slightly larger than the output terminal voltage of the semiconductor switching element during a normal OFF state, in which no short anomaly has occurred in the semiconductor switching element and an electromotive force due to the inertial rotation of a motor (as a load) is not generated.

According to the present invention, the first and second determination circuits can operate, only if the output terminal voltage of the semiconductor switching element exceeds the fourth threshold due to a short anomaly or an electromotive force of the motor during reception of the OFF signal. When the output terminal voltage of the semiconductor switching element is smaller than the fourth threshold, the current is blocked so that a leakage current during the normal OFF state is prevented.

According to the present invention, the anomaly detecting circuit is preferably configured to output the short anomaly signal if at least one of the first signal from the first determination circuit and the second signal from the second determination circuit is outputted when a predetermined time has elapsed since reception of the OFF signal.

The output terminal voltage of the semiconductor switching element may be a certain level, when the output terminal voltage is still decreasing immediately after reception of the OFF signal. In order to prevent false detection in this case, the present invention detects a short anomaly when a predetermined time has elapsed since reception of the OFF signal.

In the case that the load is a motor, the predetermined time may be set to a larger value, so that a short anomaly can be determined after variation of the output terminal voltage due to noises enhanced by an electromotive force of the motor almost settles down. Thus false detection due to the electromotive force of the motor can be prevented.

BRIEF DESCRIPTION OF THE DRAWINGS

Features and advantages of the present invention will become more apparent from the following detailed description made with reference to the accompanying drawings. In the drawings:

FIG. 6 is a table showing relation of threshold designation signals to combination of counter values of a fuse counter and an FR counter;

FIG. 11 is a table showing statuses of the gate-to-source voltage Vgs and the source voltage Vs of a power MOSFET in various states;

FIG. 13 is a table showing statuses of the source voltages of a power MOSFET and a sense MOSFET in various states.

DETAILED DESCRIPTION OF THE PRESENT INVENTION

First Embodiment

Figure 1:
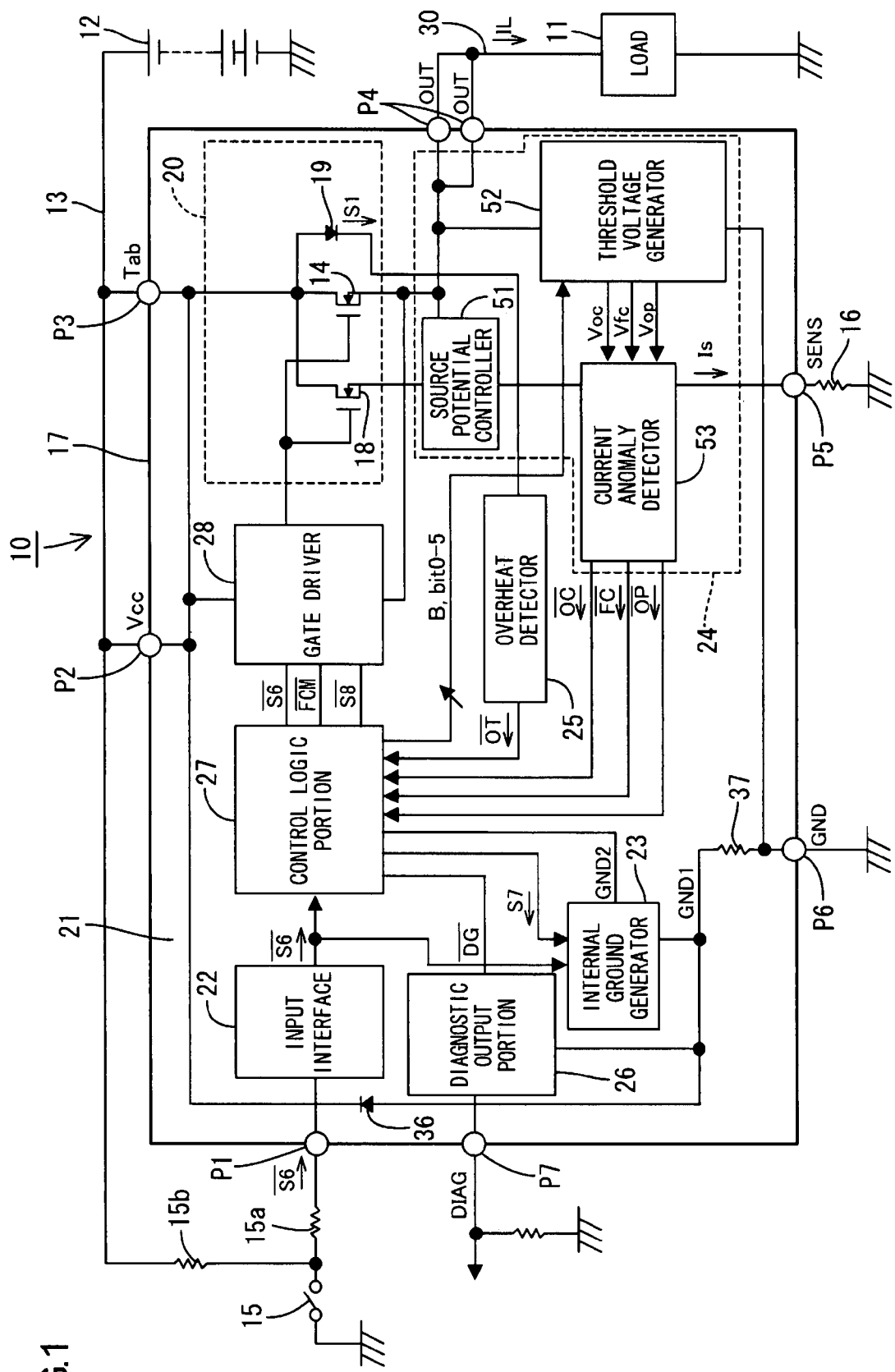
FIG. 1 is a block diagram showing the general construction of a power supply controller according to a first embodiment of the present invention.

A first embodiment of the present invention will be explained with reference to FIGS. 1 through 11. In the drawings, an overbar attached to a symbol indicating each of various signals represents that the signal is a low active signal.

1. Construction of Power Supply Controller

FIG. 1 is a block diagram showing the general construction of a power supply controller according to the present embodiment. The power supply controller can be installed on a vehicle (not shown), and used for controlling power supply from a vehicle power source 12 (hereinafter referred to as a power source) to a load 11 such as a defogger heater (i.e., a linear resistive load), a vehicle lamp or a motor (i.e., an L-load or inductive load) for a cooling fan or a wiper.

Hereinafter, the "load" means a device to be controlled by the power supply controller 10, and does not include an electric wire 30 connected between the power supply controller 10 and the controlled device. The load 11 and the electric wire 30 are collectively called an external circuit.

Specifically, the power supply controller 10 includes a power MOSFET 14 as a power FET disposed on a current supply line 13 connected between the power source 12 and the load 11. The power MOSFET 14 of the present embodiment is an example of a semiconductor switching element of the present invention.

In the power supply controller 10, a control signal S6 such as a constant voltage signal or a PWM (Pulse Width Modulation) control signal is applied to the gate of the power MOSFET 14 so as to switch the power MOSFET 14 between ON and OFF. Thereby power supply to the load 11 connected to the output side of the power MOSFET 14 is controlled.

In the present embodiment, an operation switch is externally connected to an input terminal P1 of the power supply controller 10. The power supply controller 10 operates when the operation switch 15 is ON.

Specifically the input terminal P1 is connected to the operation switch 15 via a resistor 15a, and the connecting point between the operation switch 15 and the resistor 15a is connected to the power source 12 via a resistor 15b. Thus the input terminal P1 is pulled up to the power supply voltage Vcc side when the operation switch 15 is OFF.

As shown in FIG. 1, the power supply controller 10 is formed as a semiconductor device 17, on which the input terminal P1, a power supply (Vcc) terminal P2 and a tab terminal P3 to be connected to the power source 12, a load connecting terminal P4 to be connected to the load 11, an external terminal P5 to be connected to the ground (GND) via an external resistor 16 as a current-voltage converter, a ground terminal P6 to be connected directly to the ground (GND), and a diagnostic output terminal P7 are provided.

In the present embodiment, the power MOSFET 14, a sense MOSFET 18 as a sense FET (described below) and a temperature sensor 19 (e.g., a diode in the present embodiment) as a temperature detecting element are configured onto a single chip as a power chip 20, which is mounted on a control chip 21 that includes the other circuits. The sense MOSFET 18 of the present embodiment is an example of a current detecting switching element of the present invention.

Figure 3:
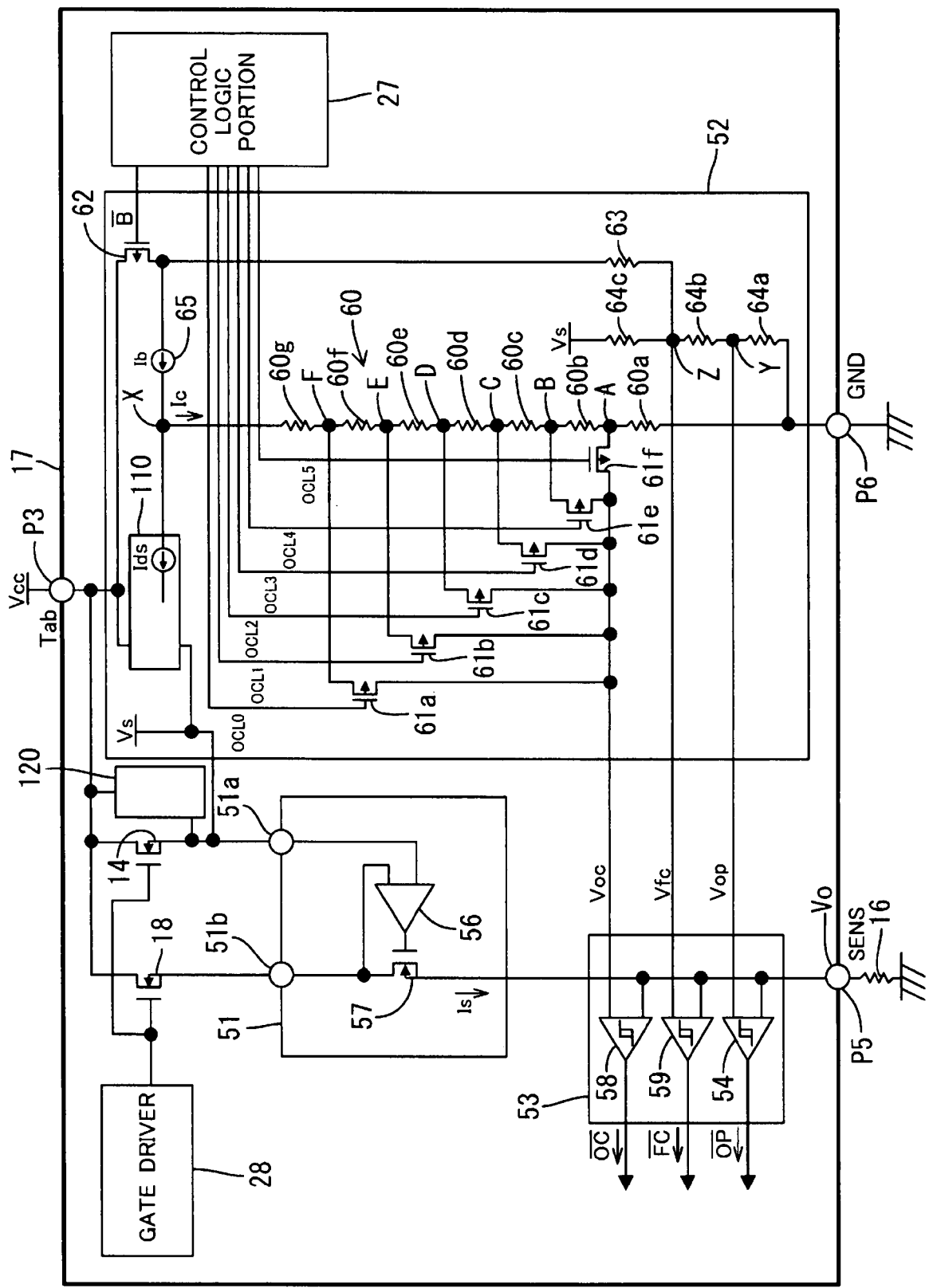
FIG. 3 is a circuit diagram showing a source potential controller, a threshold voltage generator and a current anomaly detector.

A plurality of n-channel MOSFETs are arranged on the power chip 20. The drains of the MOSFETs are connected in common to the tab terminal P3. As shown in FIG. 3, the sources of most of the MOSFETs are connected in common to a power FET input 51a of a source potential controller 51 (described below) and the load connecting terminal P4, so that the MOSFETs form the power MOSFET 14.

The sources of the rest of the MOSFETs are connected in common to a sense FET input 51b of the source potential controller 51, so that the MOSFETs form the sense MOSFET 18. The ratio of the number of MOSFETs constituting the sense MOSFET 18 to the number of MOSFETs constituting the power MOSFET 14 corresponds approximately to a sense ratio k.

The drain of the power MOSFET 14 corresponds to an input side of the semiconductor switching element of the present invention. The gate of the power MOSFET 14 corresponds to a control terminal of the semiconductor switching element of the present invention.

The drain of the sense MOSFET 18 corresponds to an input side of the current detecting switching element of the present invention. The gate of the sense MOSFET 18 corresponds to a control terminal of the current detecting switching element of the present invention.

The control chip 21 mainly includes an input interface 22, an internal ground generator 23, a current detector 24, an overheat detector 25, a diagnostic output portion 26, a control logic portion 27, and a gate driver 28 as shown in FIG. 1. Further the control chip 21 includes a short failure detector 120 for detecting a short anomaly of the power MOSFET 14 as shown in FIG. 3.

A diode 36 and a resistor 37 are serially connected between the power supply terminal P2 and the ground terminal P6 as shown in FIG. 1. The cathode side of the diode 36 is connected to the higher voltage side, and the connecting point between the diode 36 and resistor 37 is provided as an internal ground GND1.

According to this construction, if the ground terminal P6 is connected to the power supply voltage Vcc side by mistake, a current passing into the circuits of the power supply controller 10 is suppressed because of the diode 36 so as to be lower than a predetermined level.

(Input Interface)

The input side of the input interface 22 is connected to the input terminal P1. A control signal S6 of high level is inputted to the input terminal P1 when the operation switch 15 is OFF, while a control signal S6 of low level (low active signal) is inputted to the input terminal P1 when the operation switch 15 is ON. The input interface 22 receives the control signal S6, and provides that for the internal ground generator 23 and the control logic portion 27.

In a normal state (i.e., when neither a current anomaly nor a temperature anomaly has occurred, as will be described below), the power supply controller 10 turns ON the power MOSFET 14 (i.e., turns the power MOSFET 14 to a conductive state) by the gate driver 28 in response to an active (i.e., low-level) control signal S6.

On the other hand, in response to a nonactive (i.e., high-level) control signal S6, the power supply controller 10 turns OFF the power MOSFET 14 (i.e., turns the power MOSFET 14 to a shutoff state) by the gate driver 28.

An active control signal S6 of the present embodiment corresponds to an ON signal (i.e., a load ON signal for instruction to turn on the load 11) of the present invention. A nonactive control signal S6 of the present embodiment corresponds to an OFF signal of the present invention. The gate driver 28 of the present embodiment corresponds to a control circuit of the present invention.

(Internal Ground Generator)

Figure 7:
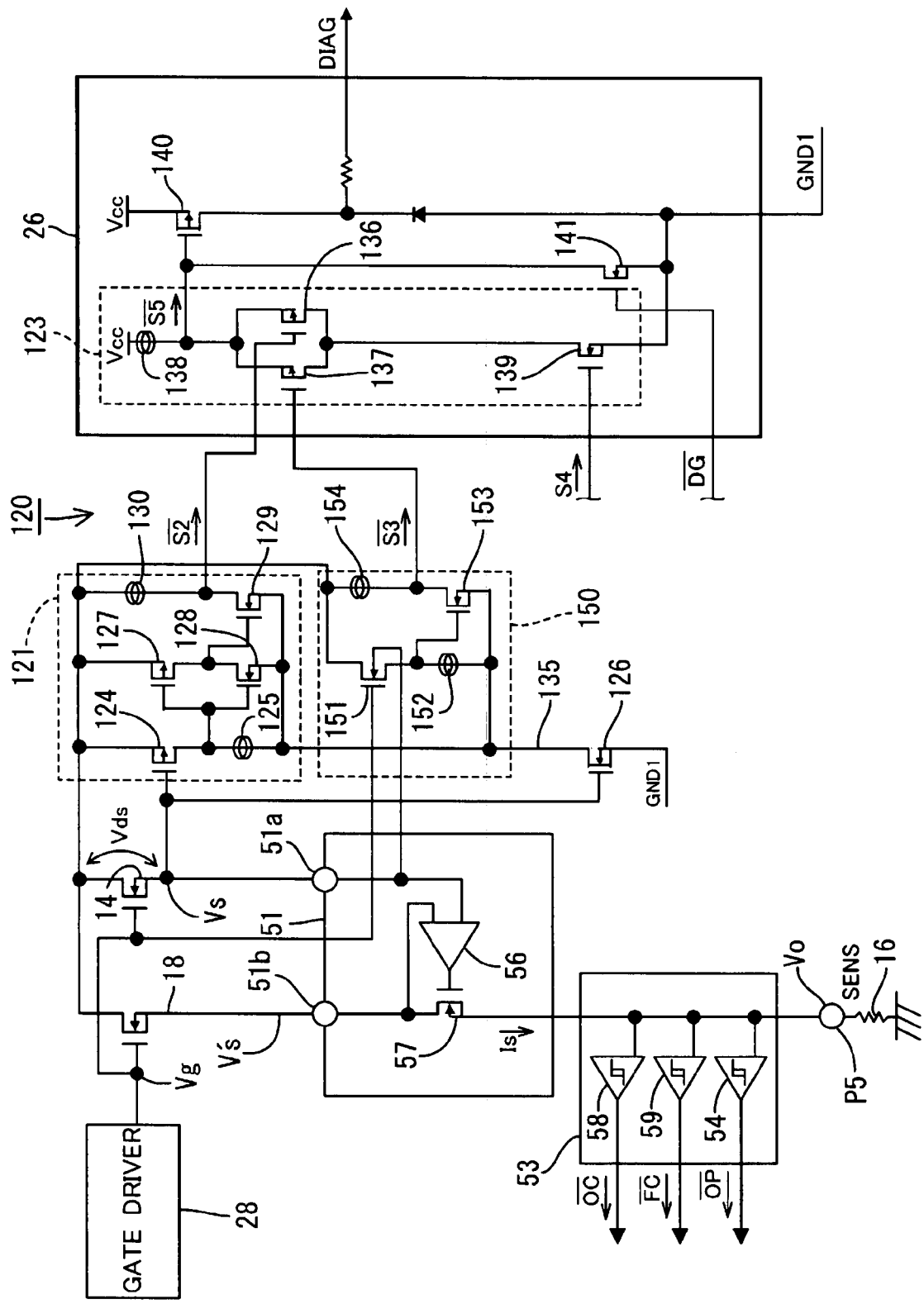
FIG. 7 is a circuit diagram showing a short failure detector.

The internal ground generator 23 as a constant supply voltage generator generates an internal ground GND2 lower than the power supply voltage Vcc by a predetermined constant voltage Vb. Further, a short time later than when the control signal S6 turns to nonactive, the internal ground generator 23 outputs a high-level signal S4 to a short anomaly detecting circuit 123 of the diagnostic output portion 26 as shown in FIG. 7. This will be described in more detail below.

The internal ground generator 23 operates, when it receives an active control signal (ON signal) S6 from the input interface 22 or a low-level output signal S7 (indicating that a clear counter 72 has not overflowed) from the control logic portion 27 described below.

That is, the internal ground generator 23 continues generation of the internal ground GND2 as far as it receives a low-level output signal S7 from the control logic portion 27 (i.e., unless the clear counter 72 overflows), even if it receives a nonactive control signal S6 (OFF signal).

Thus the constant voltage Vb (i.e., the difference determined by subtracting the internal ground GND2 from the power supply voltage Vcc) is provided for the control logic portion 27 for a short time after the control signal S6 turns to nonactive, so that the control logic portion 27 can operate.

Figure 2:
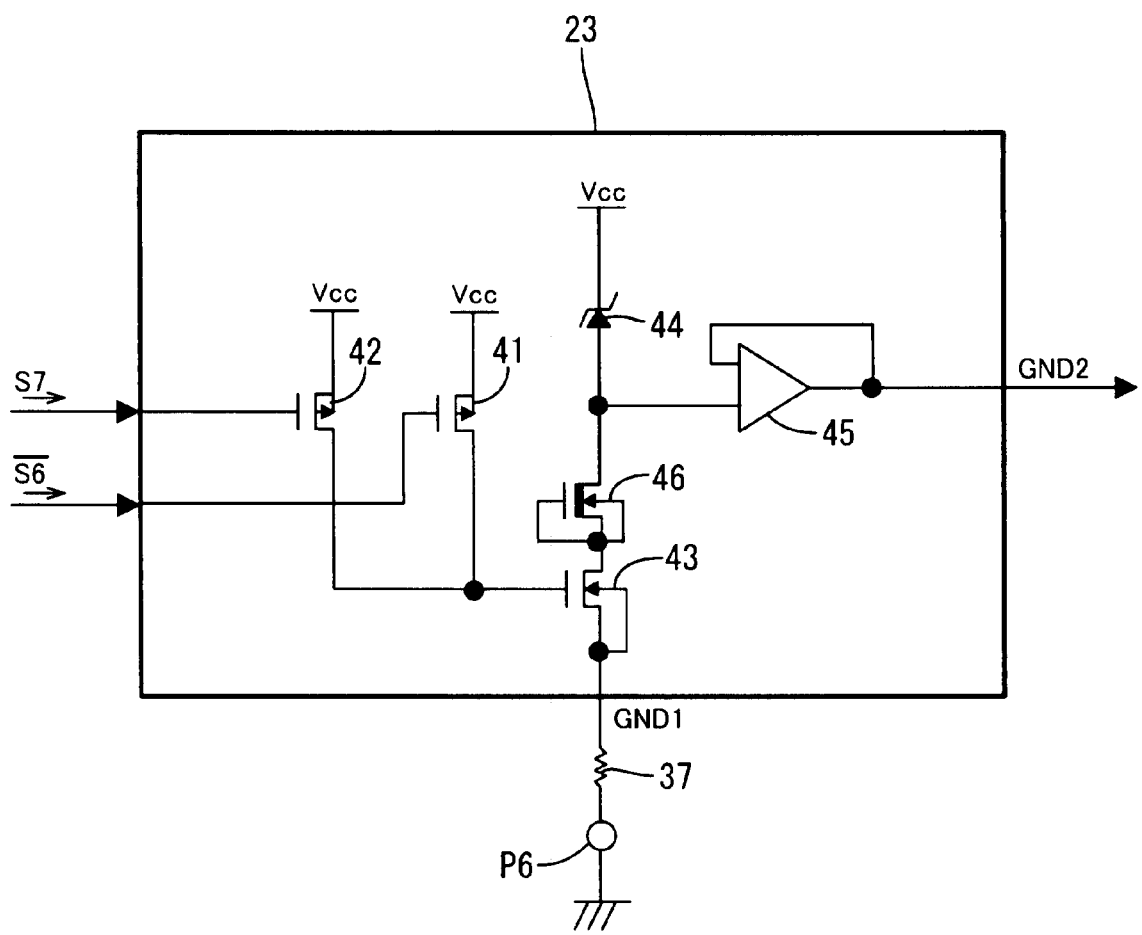
FIG. 2 is a circuit diagram showing an internal ground generator.

Specifically, as shown in FIG. 2, the internal ground generator 23 includes an FET 41 as a switching element to be turned on in response to an active control signal S6, and another FET 42 as a switching element to be turned on in response to a low-level output signal S7.

The output sides of the FETs 41, 42 are both connected to the control terminal of an FET 43 as a switching element. The input side (i.e., the drain) of the FET 43 is connected to the power supply terminal P2 via a Zener Diode 44, while the output side (i.e., the source) thereof is connected to the ground terminal P6 via the resistor 37.

In the internal ground generator 23, the FET 43 is turned on in response to an active control signal S6 or a low-level output signal S7. Thereby the internal ground generator 23 operates so as to generate the internal ground GND2, which is lower than the power supply voltage Vcc by a voltage corresponding to the Zener voltage of the Zener diode 44. The generated internal ground GND2 is provided for the control logic portion 27, via an operational amplifier 45 as a voltage follower.

In the present embodiment, an FET 46 is disposed on a current supply line between the Zener diode 44 and the FET 43, and short connection (i.e., diode connection) between the source and gate of the FET 46 is provided. Thereby a constant current passes through the Zener diode 44 when the FET 43 is on, and consequently a more stable internal ground GND2 can be generated.

(Current Detector)

The current detector 24 includes a source potential controller 51, a threshold voltage generator 52, and a current anomaly detector 53 as shown in FIG. 1. FIG. 3 is a circuit diagram mainly showing the source potential controller 51, the threshold voltage generator 52 and the current anomaly detector 53. The rest of the circuit construction is partly omitted from the diagram.

a. Source Potential Controller

The source potential controller 51 is provided for maintaining the output side voltages (i.e., the source voltages) of the power MOSFET 14 and the sense MOSFET 18 to be equal to each other. The source potential controller 51 includes an operational amplifier 56 and an FET 57 as a switching element.

A pair of input terminals of the operational amplifier 56 are connected to the power FET input 51a (and in turn to the source of the power MOSFET 14) and the sense FET input 51b (and in turn to the source of the sense MOSFET 18), respectively. The FET 57 is connected between the sense FET input 51b and the external terminal P5, and the output of the operational amplifier 56 is applied to the control terminal of the FET 57.

More specifically, the negative input of the operational amplifier 56 is connected to the power FET input 51a, while the positive input of the operational amplifier 56 is connected to the sense FET input 51b. The differential output of the operational amplifier 56 is fed back to the positive input through between the gate and drain of the FET 57.

The operational amplifier 56 is maintained in an imaginary short state due to the feedback, that is, the potentials of the positive and negative inputs are maintained almost equal to each other. Thereby the potentials of the drains of the power MOSFET 14 and the sense MOSFET 18 are maintained equal to each other, and the potentials of the sources thereof are also maintained equal to each other.

Consequently, a sense current Is passing through the sense MOSFET 18 is stably maintained to a constant ratio (i.e., the sense ratio k) to a load current IL passing through the power MOSFET 14. The sense current Is from the source potential controller 51 passes into an external resistor 16 via the external terminal P5, and therefore the terminal voltage V0 of the external terminal P5 varies with the sense current Is.

b. Current Anomaly Detector

The current anomaly detector 53 includes one comparator or a plurality of comparators. In the present embodiment, the current anomaly detector 53 includes three hysteresis comparators 54, 48, 59. The terminal voltage V0 of the external terminal P5 is applied to one input of each comparator 54, 58, 59.

A first anomaly threshold voltage Voc from the threshold voltage generator 52 is applied to the other input of the comparator 58. The comparator 58 outputs an overcurrent signal OC of low level (low active signal) to the control logic portion 27 when the terminal voltage V0 exceeds the first anomaly threshold voltage Voc.

Hereinafter, a current value, corresponding to a load current IL passing through the power MOSFET 14 when the terminal voltage V0 reaches the first anomaly threshold voltage Voc (i.e., during a current anomaly), is called "a first anomaly threshold current ILoc", and this current anomaly is called "an overcurrent".

A second anomaly threshold voltage Vfc (<Voc) from the threshold voltage generator 52 is applied to the other input of the comparator 59. The comparator 59 outputs a fuse current signal FC of low level (low active signal) to the control logic portion 27 when the terminal voltage V0 exceeds the second anomaly threshold voltage Vfc.

Hereinafter, a current value, corresponding to a load current IL passing through the power MOSFET 14 when the terminal voltage V0 reaches the second anomaly threshold voltage Vfc (i.e., during an current anomaly), is called "a second anomaly threshold current ILfc", and this current anomaly is called "a fuse current".

A third anomaly threshold voltage Vop from the threshold voltage generator 52 is applied to the other input of the comparator 54. The comparator 54 outputs a breaking indication signal OP of low level (low active signal) to the control logic portion 27 when the terminal voltage V0 is lower than the third anomaly threshold voltage Vop.

Hereinafter, a current value, corresponding to a load current IL passing through the power MOSFET 14 when the terminal voltage Vo reaches the third anomaly threshold voltage Vop (i.e., during an anomaly), is called "a third anomaly threshold current ILop", and this anomaly is called "a wire-breaking anomaly".

c. Threshold Voltage Generator

The threshold voltage generator 52 mainly includes a current output circuit 110 and a threshold setting resistor 60 as shown in FIG. 3.

The current output circuit 110 outputs a current Ic representing the difference determined by subtracting a current Ids from a current Ib. The current Ib corresponds to a predetermined constant voltage. The current Ids corresponds to the drain-to-source voltage Vds of the power MOSFET 14. The output current Ic from the current output circuit 110 passes through the threshold setting resistor 60.

Specifically, the current output circuit 110 is connected between the drain and source of the power MOSFET 14, and thereby causes a current Ids corresponding to the drain-to-source voltage Vds of the power MOSFET 14 to pass into the ground terminal P6. The drain-to-source voltage Vds of the present embodiment corresponds to an input-to-output voltage of the semiconductor switching element of the present invention.

An FET 62 and a constant current circuit 65 are connected between the input terminal of the current output circuit 110, to which the current Ids is applied, and the power supply terminal P2. The FET 62 turns on in response to a bias signal B as described below. The constant current circuit 65 causes the current Ib.

A plurality of threshold setting resistors are serially connected between the connecting point X (between the constant current circuit 65 and the input terminal of the current output circuit 110) and the ground terminal P6, so that the current Ic passes through the threshold setting resistors. In the present embodiment, seven threshold setting resistors 60a-60g are provided.

Divided voltages at the respective connecting points A-F between the threshold setting resistors 60a-60g vary in proportion to the current Ic (=Ib−Ids), i.e., in proportion to a voltage representing the difference determined by subtracting the drain-to-source voltage Vds of the power MOSFET 14 from the predetermined constant voltage.

According to this construction, the first anomaly threshold current ILoc decreases with increase of the drain-to-source voltage Vds of the power MOSFET 14, and increases with decrease of the drain-to-source voltage Vds. For example, the threshold current ILoc is set to a relatively low level immediately after the power MOSFET 14 turns ON, because the drain-to-source voltage Vds is relatively high.

Therefore, if short-circuiting occurs immediately after the power MOSFET 14 turned ON, the load current IL can reach the first anomaly threshold current ILoc early without reaching a high level. That is, the load current IL of relatively low level is detected as an overcurrent. Thus the current detector 24 can output an active overcurrent signal OC early in this case.

Further, in case that the power supply voltage Vcc decreases, the first anomaly threshold current ILoc is maintained substantially equal to the level before the decrease of the power supply voltage Vcc. This is because, even if the power supply voltage Vcc decreases, the drain-to-source voltage Vds is almost maintained as far as the power MOSFET 14 is ON. Therefore the power supply operation of the power MOSFET 14 can be sufficiently achieved, even when the power supply voltage Vcc decreases.

The threshold voltage generator 52 further includes a plurality of FETs 61a-61f as switching elements for connecting the other input terminal of the comparator 58 selectively to the connecting points A-F between the threshold setting resistors 60a-60g. Thereby the first anomaly threshold voltage Voc can be decreased stepwise by turning on the FETs 61a-61f selectively and sequentially. The ON-OFF switching of the FETs 61a-61f is controlled by the control logic portion 27 as described below.

A plurality of voltage-dividing resistors (e.g., three threshold setting resistors 64a-64c in the present embodiment) are serially connected between the source of the power MOSFET 14 and the ground terminal P6. The divided voltage at the connecting point Y between the threshold setting resistors 64a and 64b is outputted as the third anomaly threshold voltage Vop, while the divided voltage at the connecting point Z between the threshold setting resistors 64b and 64c is outputted as the second anomaly threshold voltage Vfc.

According to this construction, the second and third anomaly threshold voltages Vfc and Vop vary with the source voltage Vs of the power MOSFET 14. For example, the second anomaly threshold voltage Vfc is set to a relatively low level immediately after the power MOSFET 14 is turned ON, because the source voltage Vs of the power MOSFET 14 is relatively low level.

Therefore, in case that a fuse current occurs immediately after the power MOSFET 14 is turned ON, the load current IL can reach the second threshold current ILfc early without reaching a high level. That is, the load current IL of relatively low level is detected as a fuse current. Thus the current detector 24 can output an active fuse current signal FC early in this case.

In the present embodiment, the FET 62 and a resistor 63 are provided between the power supply terminal P2 and the connecting point Z, and thereby the second and third anomaly threshold currents ILfc and ILop are biased so as not to decrease to a negative level with variation of the load resistance of the load 11.

The FET 62 is a switching element that turns on in response to a low-level bias signal B (low active signal) from the control logic portion 27 as described above. When the FET 62 turns on, a current passes through the resistor 63 and thereby the second and third anomaly threshold voltages Vfc and Vop are pulled up to the power supply voltage Vcc side by a voltage corresponding to a voltage drop due to the resistor 63.

The low-level bias signal B is outputted from the control logic portion 27 for turning on the FET 62, when the control signal S6 is active or the clear signal CLR from the clear counter 72 is nonactive.

Figure 5:
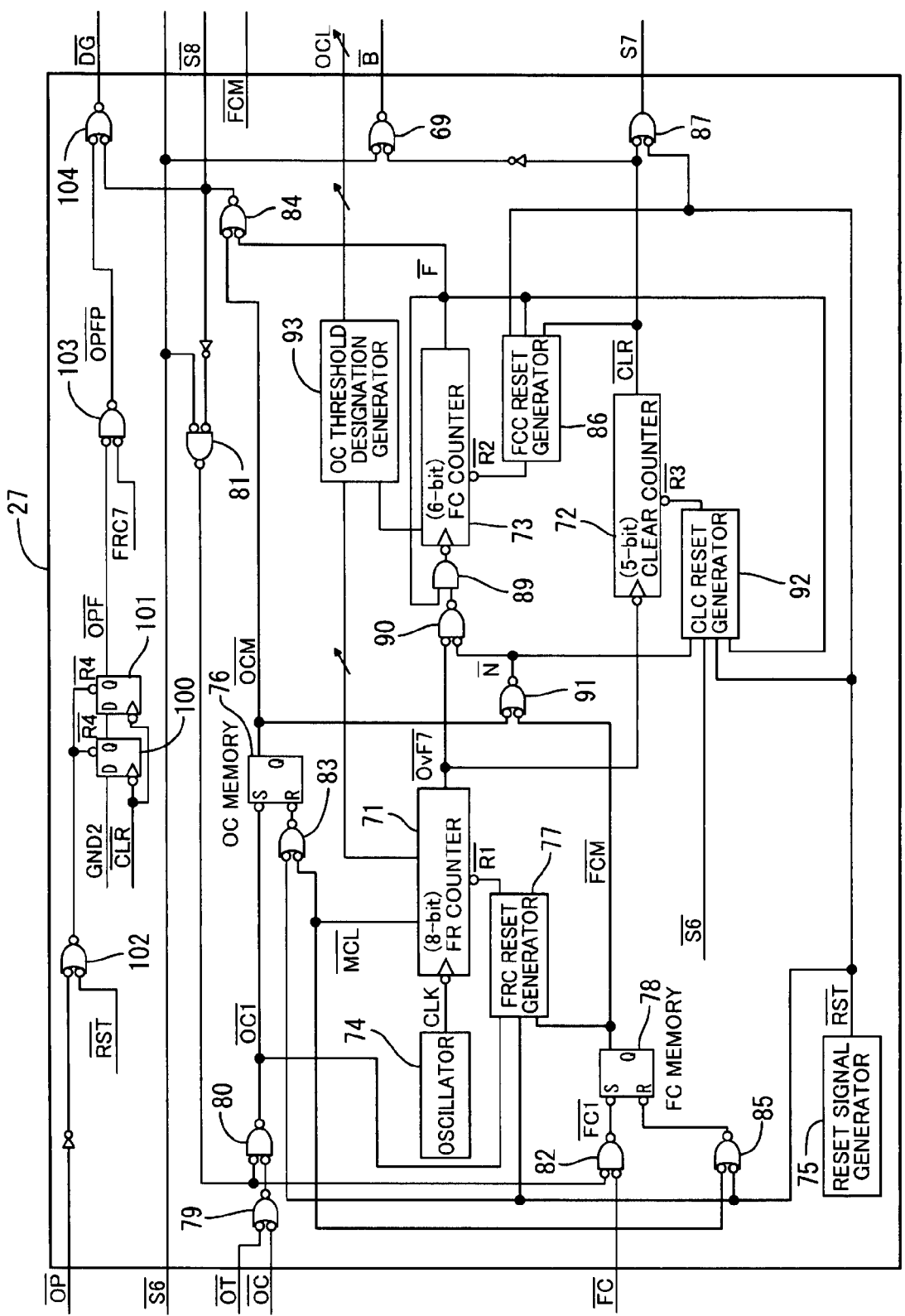
FIG. 5 is a circuit diagram showing a control logic portion.

Specifically, a NOR circuit 69 is provided in the control logic portion 27 as shown in FIG. 5. A level-inverted signal of the control signal S6 and a clear signal CLR from the clear counter 72 are inputted to the NOR circuit 69. The NOR circuit 69 outputs a low-level bias signal B (low active signal), when the control signal S6 is active and the clear signal CLR is nonactive.

On the other hand, the first anomaly threshold current ILoc can be biased by setting the current Ib so that 'Ib−Ids>0' is satisfied. Thus the current Ib can function as a bias.

Figure 4:
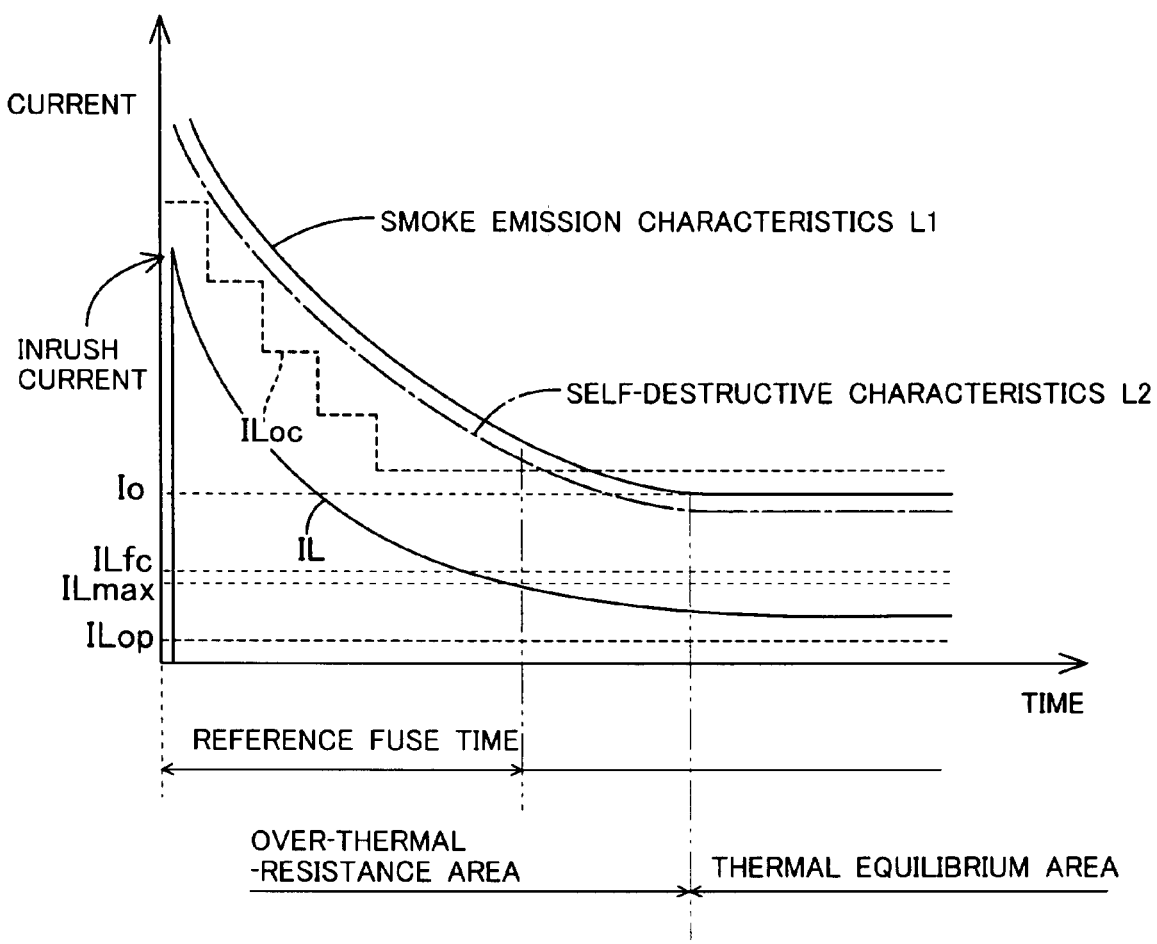
FIG. 4 is a graph for explanation of setup of threshold currents.

FIG. 4 is a graph for explanation of setup of the first, second and third anomaly threshold currents ILoc, ILfc, and ILop.

The graph shows a smoke emission characteristics curvature L1 concerning an electric wire 30 connectable to the power supply controller 10, and a self-destructive characteristics curvature L2 concerning the power MOSFET 14.

The smoke emission characteristics curvature L1 shows smoke emission characteristics of the coating material of the electric wire 30, for example, which represents the relation between a constant current level and a current-applying time (i.e., a time taken for the coating material to fuse). That is, the smoke emission characteristics curvature L1 represents the relation between an arbitrary constant current and a time taken for the coating material of the wire 30 to begin to burn (i.e., to emit smoke) while the constant current is applied to the wire 30.

The self-destructive characteristics curvature L2 represents the relation between an arbitrary constant current and a time taken for the power MOSFET 14 to break while the constant current is applied to the MOSFET 14.

The second anomaly threshold current ILfc is set to a value within the area where a current level is lower than the smoke emission characteristics curvature L1 and the self-destructive characteristics curvature L2.

The first anomaly threshold current ILoc is set to a value within the area where a current level is lower than the smoke emission characteristics curvature L1 and the self-destructive characteristics curvature L2, for a time domain corresponding to a reference FUSE time (described below) beginning with the start of count by a fuse counter 73.

Note that the shown smoke emission characteristics relates to an electric wire 30 selected from electric wires likely connected to the power supply controller 10. The smoke emission characteristics depends on an external circuit (e.g., a wiring member such as an electric wire, or a load) to be connected to the power supply controller 10.

Therefore the anomaly threshold currents ILoc, ILfc and ILop should be determined based on the smoke emission characteristics of an external circuit actually connected to the power supply controller 10. However, that can be readily achieved by adjusting the resistance of the external resistor 16.

In the graph, ILmax represents the rated current of the load 11 (i.e., a limit current against which the design of the load 11 is guaranteed). Io represents the equilibrium critical current that can be applied while maintaining a thermal equilibrium state in which heat generation and radiation in the electric wire 30 are balanced.

If a current of a higher level than the equilibrium critical current Io is applied, that relates to the over-thermal-resistance area in which a current level and a time taken for smoke emission are substantially in inverse proportion to each other.

The second anomaly threshold current ILfc is set to a value slightly larger than the rated current ILmax of the load 11 as shown in FIG. 4. The comparator 59 detects a fuse current based on whether the load current IL reaches the second anomaly threshold current ILfc, and outputs an active fuse current signal FC.

If the load current IL is around the second anomaly threshold current ILfc, the power MOSFET 14 does not need to be turned OFF immediately. In this case, the power MOSFET 14 should be turned OFF, only if the fuse current state continues for a considerable time as described below.

The third anomaly threshold current ILop is set to a value smaller than the rated current ILmax. The comparator 54 detects a wire-breaking anomaly based on whether the load current IL falls below the third anomaly threshold current ILop, and outputs an active breaking indication signal OP.

The first anomaly threshold current ILoc is set to a value larger than the second anomaly threshold current ILfc. The comparator 58 detects an overcurrent based on whether the load current IL reaches the first anomaly threshold current ILoc, and outputs an active overcurrent signal OC.

When the load current IL exceeds the first anomaly threshold current ILoc (i.e., the load current IL is significantly high level), the power MOSFET 14 should be turned OFF immediately as described below.

In preparation for an inrush current, the threshold voltage generator 52 first sets the first anomaly threshold current ILoc to a higher level (as an initial level) than the inrush current as shown in FIG. 4. Thereafter the first anomaly threshold current ILoc is decreased stepwise with time. This will be described in more detail below.

(Overheat Detector)

The overheat detector 25 receives a temperature signal S1 corresponding to a temperature of the power chip 20 from the temperature sensor 19. The overheat detector 25 detects a temperature anomaly based on whether the received temperature signal S1 exceeds a predetermined threshold temperature, and provides a low-level temperature anomaly signal OT (low active signal) for the control logic portion 27.

(Control Logic Portion)

FIG. 5 is a circuit diagram showing the control logic portion 27. The control logic portion 27 mainly includes an FR counter (a free-running counter) 71, the clear counter 72, the fuse counter (FC counter) 73, an oscillator 74, a reset signal generator 75 and the like.

The control logic portion 27 receives the control signal S6 from the input interface 22, the signals OC, FC, OP from the current detector 24, and the temperature anomaly signal OT from the overheat detector 25 as described above.

a. Oscillator and Reset Signal Generator

The oscillator 74 generates and outputs a clock signal CLK (in 125 microsecond period, for example). The reset signal generator 75 generates a constant voltage sufficient for the internal ground generator 23 and the present control logic portion 27 to operate.

Further the reset signal generator 23 outputs a reset signal RST of low level (low active signal), unless clock generation of the oscillator 74 is stabilized. When the clock generation is stabilized, the reset signal generator 23 outputs a reset signal RST of high level.

b. Overcurrent Protective Circuit

The overcurrent protective circuit mainly turns OFF the power MOSFET 14 forcibly, if at least one of an active overcurrent signal OC from the current detector 24 and an active temperature anomaly signal OT from the overheat detector 25 is received.

Thereafter the overcurrent protective circuit maintains the forcing shutoff state for a predetermined reference OFF duration (e.g., about 16 milliseconds in the present embodiment). The forcing shutoff state is released when the predetermined reference OFF duration expires. In the present embodiment, "forcing shutoff" means that the power MOSFET 14 is forcibly turned OFF although the control signal S6 is active (i.e., ON signal is received).

Specifically, the overcurrent protective circuit includes the FR counter 71, an OC memory 76, an FRC reset generator 77, an FC memory 78 and the like.

The control logic portion 27 includes a NOR circuit 79 and a NAND circuit 80. The NOR circuit 79 receives the level-inverted signals of signals OC, OT. The NAND circuit 80 receives the level-inverted signal of an output signal from the NOR circuit 79.

The level-inverted signal of a set signal OC1 from the NAND circuit 80 is inputted to the set terminal of the OC memory 76 (i.e., an RS flip-flop). The level-inverted signal of an output signal of a NAND circuit 81 is also inputted to the NAND circuit 80. The level-inverted signal of a control signal S6 and a forcing shutoff signal S8 are inputted to the NAND circuit 81. The forcing shutoff signal S8 (described below) is low level, when the forcing shutoff operation for the power MOSFET 14 should be performed.

According to this construction, while the control signal S6 is active, the NAND circuit 81 outputs a set signal OC1 of low level (low active signal), if at least one of an active overcurrent signal OC from the current detector 24 and an active temperature anomaly signal OT from the overheat detector 25 is inputted to the control logic portion 27 and the forcing shutoff signal S8 is high level.

That is, while an active control signal S6 (ON signal) is received, the NAND circuit 80 outputs an active set signal OC1 so that the OC memory 76 is turned to the set state, if an overcurrent or a temperature anomaly is detected and the power MOSFET 14 is not in the forcing shutoff state.

The control logic portion 27 further includes a NAND circuit 82. The level-inverted signal of an output signal of the NAND circuit 81 and the level-inverted signal of a fuse current signal FC are inputted to the NAND circuit 82. The level-inverted signal of a set signal FC1 (low active signal) from the NAND circuit 82 is inputted to the set terminal of the FC memory 78 (i.e., an RS flip-flop).

According to this construction, while the control signal S6 is active, the NAND circuit 82 outputs a set signal FC1 of low level (low active signal), if an active fuse current signal FC from the current detector 24 is inputted to the control logic portion 27 and the forcing shutoff signal S8 is high level.

That is, while an active control signal S6 (ON signal) is received, the NAND circuit 82 outputs an active set signal FC1 so that the FC memory 78 is turned to the set state, if a fuse current is detected and the power MOSFET 14 is not in the forcing shutoff state.

The FR counter 71 normally counts a predetermined time repeatedly. In the present embodiment, the FR counter 71 is an 8-bit free running counter, for example. The FR counter 71 increments its count value one by one at times corresponding to down edges of the clock signal CLK from the oscillator 74 (i.e., in 125 microsecond periods). The FR counter 71 overflows every 32 milliseconds, unless it is reset.

The FR counter 71 is reset to "1" (i.e., the least significant bit is "1" and the other bits are "0"), when any of the following reset conditions 1-3 is satisfied.

Reset Condition 1: The reset signal generator 75 outputs an active reset signal RST;

Reset Condition 2: The NAND circuit 80 outputs an active set signal OC1 (i.e., an overcurrent or a temperature anomaly is detected, and the power MOSFET 14 is not in the forcing shutoff state); and Reset Condition 3: The output signal FCM of the FC memory 78 is turned from high level to low level (i.e., a fuse current is detected when the power MOSFET 14 is not in the forcing shutoff state).

The FRC reset generator 77 outputs a reset signal R1 of low level (low active signal), when any of the above reset conditions is satisfied. When an active reset signal R1 is outputted, the FR counter 71 is reset to "0" and restarts the count.

The FR counter 71 outputs a count signal OvF7 of low level (low active signal), when the seven lower bits of the counter 71 overflow (i.e., all the bits are "1"). Further the FR counter 71 outputs a shutoff release signal MCL of low level (low active signal), when all the seven lower bits are "0".

That is, the FR counter 71 outputs an active count signal OvF7 (corresponding to a down edge of the count signal OvF7) at a predetermined time interval (i.e., 16 milliseconds in the present embodiment), unless it is reset. Further the FR counter 71 outputs an active shutoff release signal MCL at the predetermined time interval (same as the above), more specifically, a predetermined time (one count in the present embodiment) later than the output of an active count signal OvF7.

The level-inverted signal of an output signal from a NOR circuit 83 is inputted to the reset terminal of the OC memory 76. The level-inverted signal of a reset signal RST from the reset signal generator 75 and the level-inverted signal of a shutoff release signal MCL from the FR counter 71 are inputted to the NOR circuit 83.

According to this construction, the OC memory 76 turns to the set state in response to an active set signal OC1 as described above, so as to output a first forcing shutoff signal OCM of low level (low active signal). The OC memory 76 outputs a first forcing shutoff signal OCM of high level, when the reset signal RST or the shutoff release signal MCL is active.

A NOR circuit 84 receives the level-inverted signal of a first forcing shutoff signal OCM and the level-inverted signal of a second forcing shutoff signal F from the fuse counter 73 described below. The NOR circuit 84 outputs a forcing shutoff signal S8 of low level (low active signal), when the first forcing shutoff signal OCM or the second forcing shutoff signal F is active.

According to this construction, the overcurrent protective circuit outputs an active first forcing shutoff signal OCM from the OC memory 76 when the overcurrent signal OC or the temperature anomaly signal OT is active, so that the power MOSFET 14 is forcibly turned OFF (i.e., a forcing shutoff operation is performed) immediately.

At the same time, the FR counter 71 is reset to restart the count, and thereafter (about 16 milliseconds later in the present embodiment) outputs an active shutoff release signal MCL so that the power MOSFET 14 is restored to the ON state.

If a forcing shutoff operation is performed due to an overcurrent or a temperature anomaly, the power MOSFET 14 is thus restored to the ON state as far as the power supply controller 10 receives an active control signal S6.

Such a forcing shutoff operation caused by the overcurrent protective circuit is hereinafter referred to as "a first forcing shutoff operation". That is, a first forcing shutoff operation is performed immediately after an overcurrent or an anomaly is detected, and restored when a predetermined reference OFF duration expires. The reference OFF duration is about 16 milliseconds in the present embodiment, as described above.

The level-inverted signal of an output signal from a NOR circuit 85 is inputted to the reset terminal of the FC memory 78. The level-inverted signal of a reset signal RST from the reset signal generator 75 and the level-inverted signal of a shutoff release signal MCL are inputted to the NOR circuit 85.

According to this construction, the FC memory 78 turns to the set state in response to an active set signal FC1 as described above, so as to output an output signal FCM of low level (low active signal). Further the FC memory 78 outputs an output signal FCM of high level, when the reset signal RST or the shutoff release signal MCL is active. The FC memory 78 continues to output an active output signal FCM as far as the set signal FC1 is active, even if the reset signal RST is active.

c. Fuse Anomaly Protective Circuit

A fuse anomaly protective circuit mainly accumulates an anomaly time (hereinafter referred to as a FUSE time) during which an active fuse current signal FC is received or a first forcing shutoff operation is performed. The fuse anomaly protective circuit causes a forcing shutoff operation for the power MOSFET 14, if the accumulated time reaches a predetermined reference FUSE time (larger than the reference OFF duration).

Hereinafter, such a forcing shutoff operation caused by the fuse anomaly protective circuit is referred to as a second forcing shutoff operation. Specifically, the fuse anomaly protective circuit includes the fuse counter 73, an FCC reset generator 86 and the like.

In the present embodiment, the fuse counter 73 is a 6-bit counter. The fuse counter 73 increments its count value one by one at times corresponding to down edges of the count signal OvF7, for example. The fuse counter 73 continues the count unless it is reset, and overflows when the count value reaches 1024 milliseconds. The fuse counter 73 outputs a second forcing shutoff signal F of low level (low active signal), when it overflows.

More specifically, the level-inverted signal of an output signal of an AND circuit 89 is inputted to the clock input terminal of the fuse counter 73. The second forcing shutoff signal F from the fuse counter 73 and the output signal from a NAND circuit 90 are inputted to the AND circuit 89. The level-inverted signal of a count signal OvF7 from the FR counter 71 and the level-inverted signal of an anomaly notification signal N from a NOR circuit 91 are inputted to the NAND circuit 90.

The level-inverted signal of a first forcing shutoff signal OCM and the level-inverted signal of an output signal FCM from the FC memory 78 are inputted to the NOR circuit 91. The NOR circuit 91 outputs an anomaly notification signal N of low level (low active signal), when the first forcing shutoff signal OCM or the output signal FCM is active.

That is, the NOR circuit 91 is provided for notifying the fuse counter 73 or a CLC reset generator 92 (described below) that a first forcing shutoff operation is being performed due to an overcurrent or a temperature anomaly, or that a fuse current has occurred (i.e., a second forcing shutoff operation could be performed later).

When the anomaly notification signal N is active, the fuse counter 73 increments its count value one by one at times corresponding to down edges of the count signal OvF7 unless it overflows.

When the fuse counter 73 overflows, it outputs an active second shutoff signal F so that the power MOSFET 14 is forcibly turned OFF (i.e., a second forcing shutoff operation is performed). Once the fuse counter 73 overflows, the second shutoff signal F is maintained active so that the forcing shutoff state is maintained.

The FCC reset generator 86 outputs a reset signal R2 so as to reset the fuse counter 73 to "0", when the following reset condition 4 or 5 is satisfied.

Reset Condition 4: The reset signal generator 75 outputs an active reset signal RST; and Reset Condition 5: The second forcing shutoff signal F is nonactive (i.e., high level) and the clear signal CLR is active (i.e., the clear counter 72 has overflowed).

An OC threshold designation generator 93 obtains the counter values of the fuse counter 73 and the FR counter 71, and outputs threshold designation signals OCL0-OCL5 of low level (low active signals) based on the obtained counter values.

Specifically, as shown in FIG. 6, the OC threshold designation generator 93 sequentially outputs active threshold designation signals OCL0-OCL5 based on the higher 5 bits of the FR counter 71 (i.e., the time in milliseconds counted by the FR counter 71), when the count value FCC of the fuse counter 73 is smaller than eight.

Thereby the FETs 61a-61f are turned on selectively and sequentially, so that the first anomaly threshold voltage Voc and also the first anomaly threshold current ILoc are decreased stepwise with time (i.e., with the counted time).

When the count value FCC of the fuse counter 73 is equal to or larger than eight, the OC threshold designation generator 93 invariably outputs an active threshold designation signal OCL5, so that the first anomaly threshold voltage Voc and also the first anomaly threshold current ILoc are maintained to the lowest level.

d. Clear Counter

The clear counter 72 is provided as a normal time accumulator circuit, and operates as follows. After the fuse counter 73 starts the count in response to an overcurrent, a fuse current or a temperature anomaly, the anomaly may be eliminated without the fuse counter 73 reaching the overflow.

That is, a normal state, in which the load current IL is normal level (i.e., smaller than the second anomaly threshold current ILfc, and therefore also smaller than the first anomaly threshold current ILoc) and the temperature is also normal, may be restored.

In this case, the clear counter 72 mainly outputs a clear signal CLR of low level (low active signal), if such a normal state continues for a predetermined reference NORMAL duration (e.g., 512 milliseconds in the present embodiment). When an active clear signal CLR is outputted, the count value (i.e., FUSE time) of the fuse counter 73 is reset to the initial value "0".

The reference NORMAL duration is determined based on a time taken for elimination of the overheat state of an external circuit after elimination of a fuse current or an overcurrent, for example. In the present embodiment, the reference NORMAL duration is set to 512 milliseconds as described above.

Specifically, the clear counter 72 is a 5-bit counter, for example. The clear counter 72 increments its count value one by one at times corresponding to down edges of the count signal OvF7 from the FR counter 71, unless it is reset. When the time counted by the clear counter 72 reaches 512 milliseconds (i.e., the reference NORMAL duration), the clear counter 72 overflows and outputs an active clear signal CLR.

The CLC reset generator 92 outputs a reset signal R3 of low level (low active signal) so that the clear counter 72 is reset to "0", when any of the following reset conditions 6-8 is satisfied.

Reset Condition 6: The reset signal generator 75 outputs an active reset signal RST;

Reset Condition 7: The second forcing shutoff signal F is nonactive (i.e., a second forcing shutoff operation has not been performed yet) and the anomaly notification signal N is active; and Reset Condition 8: The second forcing shutoff signal F is active (i.e., a second forcing shutoff operation is being performed) and the control signal S6 is active.

The control logic portion 27 further includes an OR circuit 87 for outputting the output signal S7. The level-inverted signal of a clear signal CLR and the level-inverted signal of a reset signal RST are inputted to the OR circuit 87. The OR circuit 87 outputs an output signal S7 of high level so that the internal ground generator 23 terminates its operation, when the clear signal CLR or the reset signal RST is active.

f. Invalidation Circuit

The NAND circuit 81 is provided as an invalidation circuit. The level-inverted signal of a control signal S6 and the forcing shutoff signal S8 (which is low level when the power MOSFET 14 should be forcibly turned OFF) are inputted to the NAND circuit 81 as described above. The output signal of the NAND circuit 81 is level-inverted and inputted to the NAND circuits 80 and 82.

According to this construction, the NAND circuit 81 outputs a high-level output signal, when the control signal S6 is nonactive (i.e., OFF signal is received). Thereby the output signals of the NAND circuits 80, 82 are maintained high level in this case, even if the current anomaly detector 53 outputs an active overcurrent signal OC or an active fuse current signal FC, or the overheat detector 25 outputs an active temperature anomaly signal OT.

That is, the active overcurrent signal OC, fuse current signal FC and temperature anomaly signal OT are invalidated (i.e., masked) when the control signal S6 is nonactive, so that the OC memory 76 or the FC memory 78 would not turn to the set state.

For example, in the case that the load 11 is an L-load, the source voltage Vs of the power MOSFET 14 may be pulled to the negative side due to the surge voltage of the load 11, when the power MOSFET 14 is turned OFF in response to a nonactive control signal S6 (OFF signal). Therefore the second and third anomaly threshold voltages Vfc and Vop, which are generated based on the source voltage Vs of the power MOSFET 14, may be also negative in this case.

Then an active fuse current signal FC or breaking indication signal OP as an anomaly signal may be outputted from the current anomaly detector 53, even if a fuse current or a wire-breaking anomaly has not occurred.

However, in the present embodiment, the invalidation circuit invalidates the active fuse current signal FC in this case. Thereby the fuse counter 73 is prevented from incrementing its count value, and consequently a second forcing shutoff operation can be prevented from being wrongly performed.

g. Filter Circuit

The control logic portion 27 includes a filter circuit for filtering the breaking indication signal OP. The filter circuit includes a counter circuit comprising a plurality of memory circuits (e.g., two memory circuits 100, 101 in the present embodiment) serially connected to one another. Each of the memory circuits 100, 101 is a D flip-flop, for example.

The internal ground GND2 is applied to the D-terminal of the memory circuit 100, and the Q-terminal thereof is connected to the D-terminal of the next memory circuit 101. The clear signal CLR is inputted to the set terminals of both memory circuits 100, 101, and an output signal R4 from a NOR circuit 102 is inputted to the reset terminals of the memory circuits 100, 101. The level-inverted signal of a reset signal RST from the reset signal generator 75 and the breaking indication signal OP are inputted to the NOR circuit 102.

According to this construction, while the reset signal RST is nonactive and the breaking indication signal OP is active, the filter circuit outputs a breaking anomaly signal OPF of low level (low active signal) from the Q terminal of the memory circuit 101 if it has received an active clear signal CLR two or more times (e.g., two times in the present embodiment).

The filter circuit is reset when any of the following reset conditions is satisfied.

Reset Condition 9: The reset signal generator 75 outputs an active reset signal RST; and Reset Condition 10: The breaking indication signal OP is nonactive (i.e., high level).

According to this construction, the breaking anomaly signal OPF is not immediately turned to active, if the current detector 24 outputs an active breaking indication signal OP. The breaking anomaly signal OPF is turned to active, when the filter circuit has received an active clear signal CLR two times from the current detector 24 during the active breaking indication signal OP.

That is, the breaking anomaly signal OPF can become active, when at least a time of the reference NORMAL duration has elapsed since the active breaking indication signal OP.

The breaking anomaly signal OPF outputted from the Q-terminal of the memory circuit 101 is level-inverted, and inputted to a NAND circuit 103. A bit signal corresponding to a predetermined bit (e.g., the most significant bit FRC7 in the present embodiment) of the FR counter 71 is inputted to the NAND circuit 103, so that the NAND circuit 103 outputs a pulsed breaking anomaly signal OPFP which is pulsed according to the inverted level of the bit signal.

In the present embodiment, a pulsed breaking anomaly signal OPFP is outputted in 32 millisecond periods with a duty ratio of 50%, because the bit signal corresponds to the most significant bit FRC7 of the FR counter 71 as described above.

When the breaking indication signal OP turns to nonactive, the filter circuit immediately turns the pulsed breaking anomaly signal OPFP to a normal signal indicating a normal state (i.e., to a high-level signal).

The level-inverted signal of a pulsed breaking anomaly signal OPFP and the level-inverted signal of a forcing shutoff signal S8 from the NOR circuit 84 are inputted to a NOR circuit 104. The NOR circuit 104 outputs a diagnostic signal DG to the diagnostic output portion 26.

The diagnostic output portion 26 provides a diagnostic output DIAG on the diagnostic terminal P7 based on the diagnostic signal DG. More specifically, the diagnostic output portion 26 outputs different patterns of diagnostic outputs DIAG depending on whether the detected anomaly is a wire-breaking anomaly or any of the other anomalies (i.e., an overcurrent, a fuse current, and a temperature anomaly). This will be described in more detail below.

(Gate Driver)

The gate driver 28 includes a charge pump (not shown) connected between the power supply terminal P2 and the gates of the power MOSFET 14 and sense MOSFET 18, and a discharge FET (also not shown) connected between the gates and sources of the power MOSFET 14 and sense MOSFET 18.

To the gate driver 28, the control signal S6, the output signal FCM of the FC memory 78 and the forcing shutoff signal S8 are inputted from the control logic portion 27.

When the gate driver 28 receives an active control signal S6 (ON signal) from the control logic portion 27, the charge pump operates so as to generate a higher voltage from the power supply voltage Vcc, while the discharge FET is maintained off. The generated higher voltage is applied to between the gate and source of each of the power MOSFET 14 and the sense MOSFET 18. Thus a charging operation is performed, and thereby the power MOSFET 14 and the sense MOSFET 18 are turned ON.

When the gate driver 28 receives a nonactive control signal S6 (OFF signal) or an active forcing shutoff signal S8 indicating that a first or second forcing shutoff operation should be performed, the discharge FET is turned ON while charge pump is turned OFF. Thereby generation of a higher voltage is stopped, and the charge between the gate and source of each of the power MOSFET 14 and the sense MOSFET 18 is released. Thus a shutoff operation is performed.

(Short Failure Detector)

FIG. 7 is a circuit diagram showing the short failure detector 120. The short failure detector 120 includes a first determination circuit 121, a second determination circuit 150 and the short anomaly detecting circuit 123. The short anomaly detecting circuit 123 of the present embodiment corresponds to an anomaly detecting circuit of the present invention.

The first determination circuit 121 and the second determination circuit 150 are provided on the control chip 21. The short anomaly detecting circuit 123 is provided in the diagnostic output portion 26 on the control chip 21.

a. First Determination Circuit

The first determination circuit 121 relates to detection of short-circuiting between the drain and source of the power MOSFET 14 (hereinafter referred to as a power MOS short), and includes an FET 124 as a semiconductor switching element that turns off when the drain-to-source voltage Vds of the power MOSFET 14 falls below the threshold voltage Vt1 (hereinafter referred to as a first threshold voltage) of the FET 124.

The FET 124 is of p-channel type. The source of the FET 124 is connected to the drain of the power MOSFET 14, and the gate thereof is connected to the source of the power MOSFET 14. Therefore the FET 124 turns off, when the drain-to-source voltage Vds of the power MOSFET 14 falls below the first threshold voltage Vt1.

The first threshold voltage Vt1 of the present embodiment is an example of a first threshold of the present invention. The drain of the FET 124 is connected to the resistor 37 (shown in FIG. 1) via a constant current circuit 125 and an n-channel type FET 126.

The first determination circuit 121 further includes FETs 127 and 128. The FET 127 turns on, when the FET 124 turns off. The FET 128 turns off, when the FET 124 turns off.

The FET 127 is of p-channel type. The source of the FET 127 is connected in common to the source of the FET 124, and the gate thereof is connected to the drain of the FET 124.

The FET 128 is of n-channel type. The source of the FET 128 is connected to the downstream side of the constant current circuit 125, and the drain of the FET 128 is connected to the drain of the FET 127. The gate of the FET 128 is connected to the drain of the FET 124.

The first determination circuit 121 further includes an FET 129, which is of n-channel type and turns on when the FET 128 turns off. The source thereof is connected in common to the source of the FET 128, and the gate is connected to the drain of the FET 128. The drain of the FET 129 is connected to the sources of the FETs 124 and 127 via a constant current circuit 130.

According to this construction, when the drain-to-source voltage Vds of the FET 124 falls below the first threshold voltage Vt1, the FET 129 turns on and thereby the first determination circuit 121 outputs a first determination signal S2 of low level (low active signal). The first determination signal S2 of the present embodiment is an example of a first signal of the present invention.

The first threshold voltage Vt1 is set to a level slightly higher than the drain-to-source voltage Vds of the power MOSFET 14 when short-circuiting between the drain and source of the power MOSFET 14 has occurred and the control signal S6 is nonactive.

Further, in the case that the load 11 is a motor, the first threshold voltage Vt1 is set so as to be lower than the drain-to-source voltage Vds of the power MOSFET 14 when an electromotive force is generated due to the inertial rotation of the motor after the control signal S6 turns to nonactive.

b. Second Determination Circuit

The second determination circuit 150 relates to detection of short-circuiting between the drain and gate of the power MOSFET 14 (hereinafter referred to as a drain-gate short), and includes an FET 151 as a semiconductor switching element which turns on when the gate-to-source voltage Vgs (i.e., the difference determined by subtracting the source voltage Vs from the gate voltage Vg) of the power MOSFET 14 becomes equal to or larger than the threshold voltage Vt2 (hereinafter referred to as a second threshold voltage) of the FET 151.

The gate voltage Vg of the present embodiment is an example of a control terminal voltage of the semiconductor switching element of the present invention. The source voltage Vs of the present embodiment is an example of an output terminal voltage of the semiconductor switching element of the present invention. The second threshold voltage Vt2 of the present embodiment is an example of a second threshold of the present invention.

The FET 151 is of n-channel type. The drain thereof is connected in common to the drain of the power MOSFET 14, and the gate is connected in common to the gate of the power MOSFET 14. The back gate of the FET 151, which is provided for applying a reference voltage of the gate, is connected in common to the source of the power MOSFET 14. The source of the FET 151 is connected to the FET 126 via a constant current circuit 152.

The second determination circuit 150 further includes an FET 153, which is of n-channel type and turns on when the FET 151 turns on. The drain of the FET 153 is connected to the drain of the power MOSFET 14 via a constant current circuit 154, and the gate of the FET 153 is connected to the source of the FET 151. The source of the FET 153 is connected to the FET 126.

According to this construction, when the difference determined by subtracting the source voltage Vs of the power MOSFET 14 from the gate voltage Vg thereof is equal to or larger than the second threshold voltage Vt2, the FET 153 turns on and thereby the second determination circuit 150 outputs a second determination signal S3 of low level (low active signal).

The second threshold voltage Vt2 is set to a level slightly lower than the gate-to-source voltage of the sense MOSFET 18 when short-circuiting between the drain and gate of the power MOSFET 14 (i.e., a drain-gate short) has occurred and the control signal S6 is nonactive.

In the present embodiment, the second determination circuit 150 thus determines whether the power MOSFET 14 is in an ON state or not based on the gate-to-source voltage Vgs of the power MOSFET 14. The second determination signal S3 of the present embodiment is an example of a second signal of the present invention.

In the short failure detector 120, the above-described FET 126 is disposed on a current supply line 135 for the first and second determination circuits 121 and 150. The gate of the FET 126 is connected to the source of the power MOSFET 14.

The current supply line 135 of the present embodiment is an example of a current path of the present invention, along which a current passes from the power source to the first determination circuit and the second determination circuit.

According to this construction, when the power MOSFET 14 is ON and the source voltage Vs thereof is higher than the threshold voltage Vt4 (hereinafter referred to a fourth threshold voltage) of the FET 126, the FET 126 turns on so as to enable the first and second determination circuits 121 and 150 to operate.

When the power MOSFET 14 normally turns OFF and the source voltage Vs thereof is lower than the fourth threshold voltage Vt4, the FET 126 turns off so as to block the current passing into the first and second determination circuit 121, 150.

The fourth threshold voltage Vt4 of the present embodiment is an example of a fourth threshold of the present invention. The fourth threshold voltage Vt4 is set to a level slightly higher than the source voltage Vs of the power MOSFET 14 during a normal OFF state, in which no short anomaly has occurred in the power MOSFET 14 and an electromotive force due to the inertial rotation of a motor is not generated.

Therefore, the source voltage Vs of the power MOSFET 14 is lower than the fourth threshold voltage Vt4, when no short anomaly has occurred and the power MOSFET 14 is normally turned OFF. That is, the FET 126 is off and thereby a current on the current supply line 135 is blocked in this case. Thus the FET 126 functions as a leakage current block circuit, which prevents a leakage current when the power MOSFET 14 is in the normal OFF state and no short anomaly has occurred.

c. Short Anomaly Detecting Circuit

The short anomaly detecting circuit 123 includes an FET 136 that turns on in response to an active first determination signal S2, and an FET 137 that turns on in response to an active second determination signal S3.

The FETs 136, 137 are of p-channel type, and the sources thereof are connected in common to each other and further connected to the power supply terminal P2 via a constant current circuit 138. The drains thereof are connected in common to each other and further connected to the resistor 37 (shown in FIG. 1) via an FET 139.

The FET 139 turns on in response to a high-level signal S4 from the internal ground generator 23. The internal ground generator 23 outputs a high-level signal S4, when a predetermined time (e.g., 2 milliseconds in the present embodiment) has elapsed since reception of a nonactive control signal S6 (OFF signal).

When the FET 139 is on, the short anomaly detecting circuit 123 can output an output signal S5 of low level (low active signal) in response to an active first or second determination signal S2 or S3.

That is, the short anomaly detecting circuit 123 outputs an output signal S5 of high level (i.e., a nonactive output signal S5) until the predetermined time (2 milliseconds) has elapsed since reception of a nonactive control signal S6, even if an active first or second determination signal S2, S3 is received.

When the predetermined time has elapsed since reception of the nonactive control signal S6, the short anomaly detecting circuit 123 can output an active output signal S5 in response to an active first or second determination signal S2, S3.

Thus the short failure detector 120 detects a short anomaly of the power MOSFET 14 when the control signal S6 is nonactive, or more specifically, when the predetermined time (2 milliseconds) has elapsed since reception of the nonactive control signal S6.

An active output signal S5 of the present embodiment is an example of a short anomaly signal of the present invention. The predetermined time (2 milliseconds) of the present embodiment corresponds to a predetermined time of the present invention.

(Diagnostic Output Portion)

The diagnostic output portion 26 includes the short anomaly detecting circuit 123 of the short failure detector 120 as described above. The diagnostic output portion 26 further includes two FETs 140 and 141 as shown in FIG. 7.

When the control signal S6 is nonactive (or more specifically, when 2 milliseconds has elapsed since the nonactive control signal S6), the short anomaly detecting circuit 123 can output an active output signal S5 indicating a short anomaly occurrence as described above. The FET 140 turns on in response to an active output signal S5, and thereby the diagnostic output portion 26 provides a diagnostic output DIAG of high level on the diagnostic terminal P7 so as to notify the external that a short anomaly of the power MOSFET 14 has occurred.

On the other hand, the FET 141 switches between on and off according to a diagnostic signal DG from the control logic portion 27, and thereby the diagnostic output portion 26 can provide a diagnostic output DIAG on the diagnostic terminal P7 based on the diagnostic signal DG.

More specifically, the diagnostic output portion 26 provides a pulsed diagnostic output DIAG, when the diagnostic signal DG indicates a wire-breaking anomaly. The diagnostic output portion 26 provides a stepwise diagnostic output DIAG, when the diagnostic signal DG indicates any of the other anomalies.

According to this construction, a wire-breaking anomaly can be distinguished from the other anomalies (i.e., an overcurrent, a fuse current and a temperature anomaly) by the diagnostic output DIAG.

2. Operation According to the Present Embodiment

Figure 8:
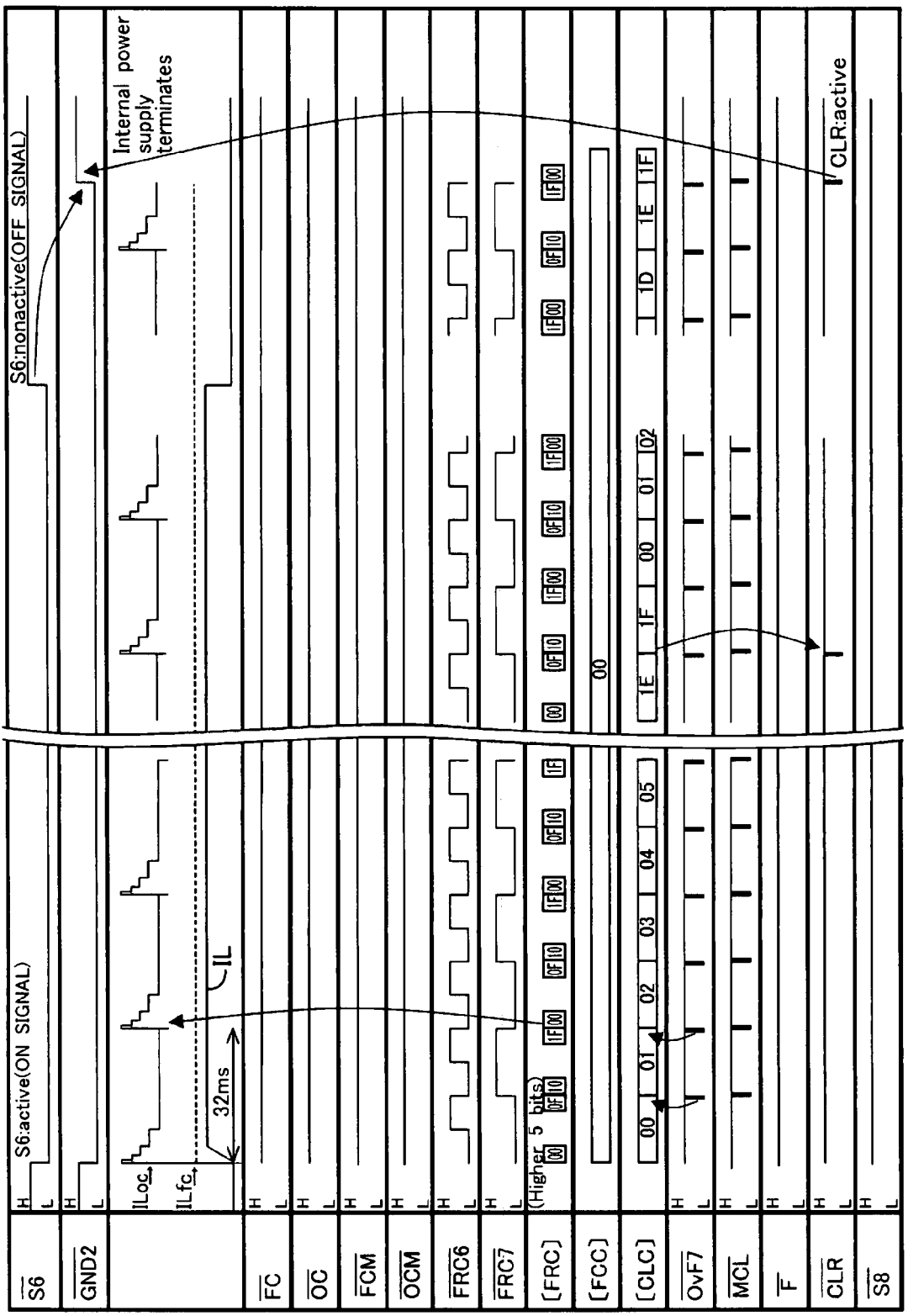
FIG. 8 is a timing chart of various signals during a normal operation of the power supply controller.
Figure 9:
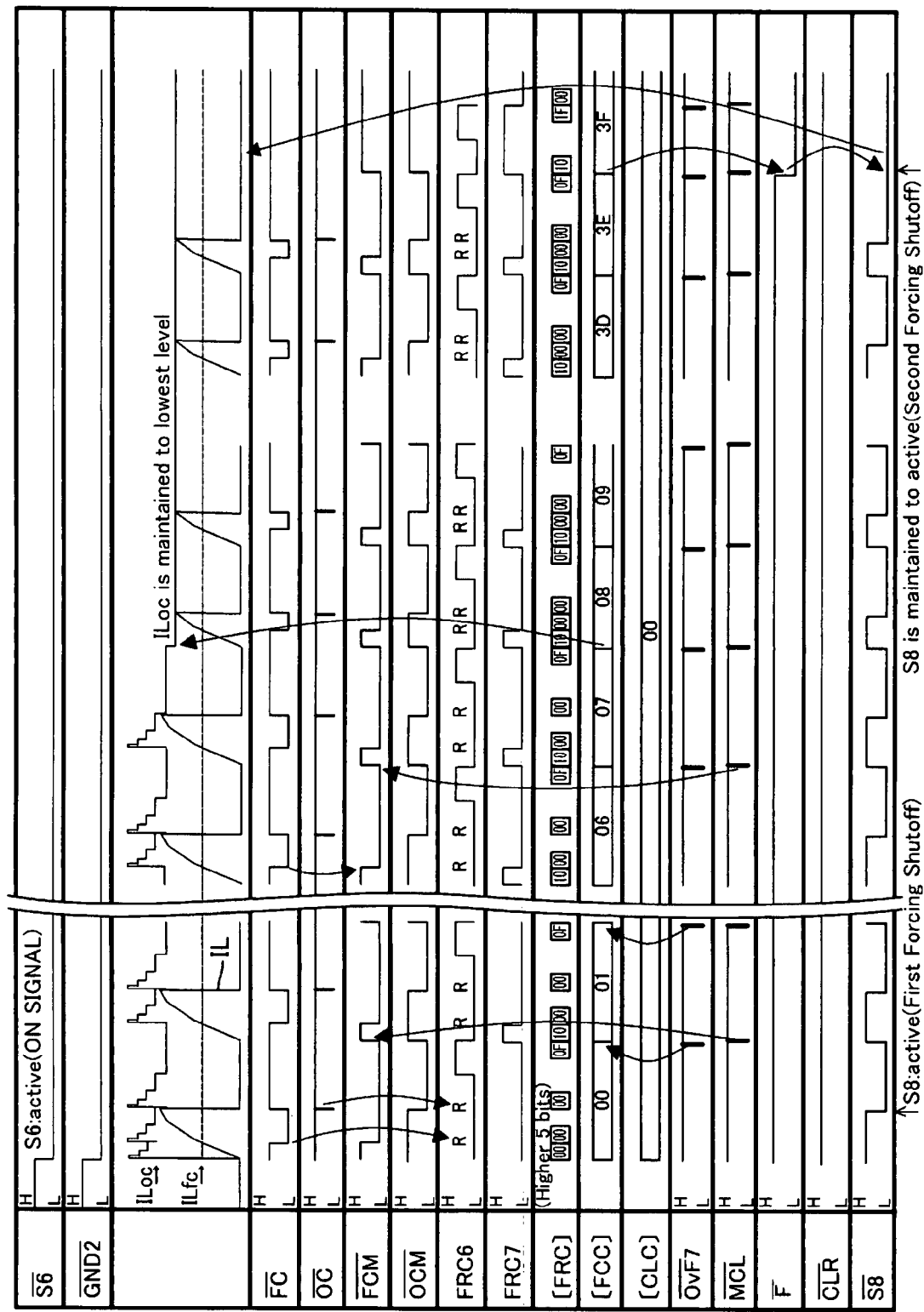
FIG. 9 is a timing chart of various signals during an overcurrent occurrence.
Figure 10:
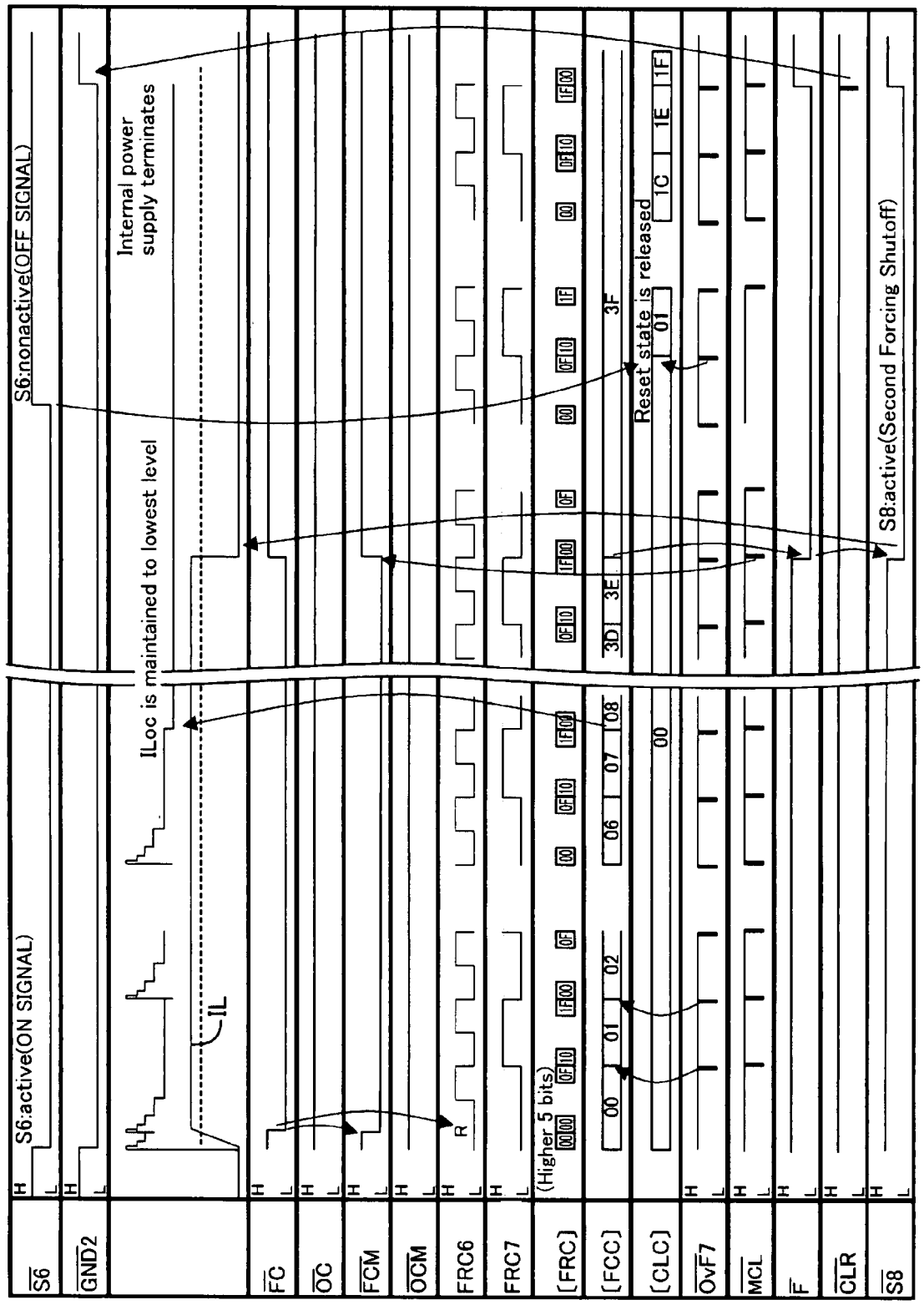
FIG. 10 is a timing chart of various signals during a fuse current occurrence.

The operation of the power supply controller 10 will be explained with reference to FIGS. 8 through 11. FIGS. 8 to 10 are timing charts for explanation of the operation. FIG. 8 relates to a normal operation. FIG. 9 relates to an operation during an overcurrent occurrence. FIG. 10 relates to an operation during a fuse current occurrence. FIG. 11 is a table for explanation of an operation during a short anomaly of the power MOSFET 14.

In the drawings, [FRC] represents the higher 5 bits of the FR counter 71 (i.e., the time in milliseconds counted by the FR counter 71). [FCC] represents the count value of the fuse counter 73. [CLC] represents the count value of the clear counter 72. The count values or counted times are shown in hexadecimal (e.g. "A" means 10 in decimal, "B" means 11 in decimal, "C" means 12 in decimal and the like).

Further, in the drawings, "FRC7" represents the most significant bit of the FR counter 71, and how the most significant bit changes between high and low levels with time is shown in "FRC7" field. "FRC6" represents the second significant bit of the FR counter 71, and how the second significant bit changes between high and low levels with time is shown in "FRC6" field. "R" in the drawings means "reset".

(Normal Operation)

When the power supply controller 10 receives an active control signal S6, the internal ground generator 23 generates an internal ground GND2. When the internal ground GND2 stabilizes, the reset signal RST outputted from the reset signal generator 75 turns from active to nonactive, so that the counters 71-73 are reset.

The active control signal S6 is provided for the gate driver 28 via the control logic portion 27. Then the power MOSFET 14 turns ON (i.e., turns to the conductive state).

The FR counter 71 begins to count according to the clock signal CLK from the oscillator 74, when it is reset. During the normal operation, an active set signal OC1 is not outputted from the NAND circuit 80 (i.e., the above reset condition 2 is not satisfied), and the output signal FCM of the FC memory 78 is not turned from high to low level (i.e., the reset condition 3 is not satisfied). Therefore the FR counter 71 repeatedly counts to 32 milliseconds without being reset in the middle of the count (See [FRC] field in FIG. 8).

At the same time, the OC threshold designation generator 93 sequentially generates active threshold designation signals OCL0-OCL5 depending on the value of the higher 5 bits of the FR counter 71, so that the first anomaly threshold current ILoc decreases with time. Specifically, the first anomaly threshold current ILoc decreases stepwise according to the threshold designation signals OCL0-OCL5 beginning with the initial level higher than an inrush current. This threshold decreasing operation beginning with the initial level is iterated in 32 millisecond periods.

When the control signal S6 turns to active, an inrush current larger than the second anomaly threshold current ILfc may pass into the power MOSFET 14. In the present embodiment, the first anomaly threshold current ILoc is initially set to the level (initial level) higher than the inrush current as described above, and thereby a first forcing shutoff operation due to the inrush current can be prevented.

During the normal operation, the anomaly notification signal N is not active, and therefore the fuse counter 73 does not start the count (See [FCC] field in FIG. 8).

The clear counter 72 increments its count value one by one at times corresponding to down edges of the count signal OvF7 outputted from the FR counter 71 (See [CLC] field in FIG. 8). The clear counter 72 counts to 512 milliseconds (corresponding to the reference NORMAL duration) without being reset in the middle of the count, since the anomaly notification signal N and the second forcing shutoff signal F are both maintained nonactive (i.e., none of the reset conditions is satisfied). When the count reaches 512 milliseconds, the clear counter 72 overflows and outputs an active clear signal CLR (See "CLR" field in FIG. 8).

If the control signal S6 turns from active to nonactive, the internal ground generator 23 thereafter terminates generation of the internal ground GND2 at the time of overflow of the clear counter 72. That is, the internal ground generator 23 continues generation of the internal ground GND2 until the clear counter 72 overflows, even if the control signal S6 turns to nonactive.

(Operation During Overcurrent Occurrence)

If short-circuiting occurs, for example, in the load 11, the load current IL may exceed the second anomaly threshold current ILfc as shown in FIG. 9. At the time, the fuse current signal FC turns to active, so that the output signal FCM of the FC memory 78 turns from high to low level and the FR counter 71 is reset. Thereby the first anomaly threshold current ILoc, which has been decreased stepwise, is restored to the initial level, and thereafter decreased again with time according to the count value of the FR counter 71.

When the load current IL thereafter exceeds the first anomaly threshold current ILoc, the overcurrent signal OC turns to active. In response to this, the set signal OC1 from the NAND circuit 80 turns to active, and thereby the first forcing shutoff signal OCM turns to active. Then the forcing shutoff signal S8 turns to active, so that a first forcing shutoff operation is performed.

Further the FR counter 71 is reset in response to the active set signal OC1, so that ILoc is restored to the initial level and thereafter decreased again. An active count signal OvF7 (corresponding to a down edge of the count signal OvF7) is outputted 16 milliseconds later than the reset of the FR counter 71 and, in response to this, the fuse counter 73 increments its count value by one (See [FCC] field in FIG. 9).

An active shutoff release signal MCL is outputted slightly after the active count signal OvF7 and, in response to this, the OC memory 76 outputs a nonactive first forcing shutoff signal OCM so that the power MOSFET 14 is turned ON. Thus the forcing shutoff state is released.

If the short-circuiting in the load 11 is thereafter not eliminated, the clear counter 72 does not start the count, and the first forcing shutoff operation is performed repeatedly. During the iteration of the first forcing shutoff operation, the fuse counter 73 increments its count value one by one at times corresponding to the release of the forcing shutoff state (i.e., at times corresponding to down edges of the count signal OvF7).

If the count value [FCC] of the fuse counter 73 reaches eight during the iteration of the first forcing shutoff operation (i.e., the first forcing shutoff operation has performed eight times), the OC threshold designation generator 93 thereafter keeps outputting an active threshold designation signal OCL5 so that the first anomaly threshold current ILoc is maintained to the lowest level.

Thereafter, the first forcing shutoff operation may be further performed repeatedly, when an overcurrent is detected based on the first anomaly threshold current ILoc of lowest level. During the iteration of the first forcing shutoff operation, the fuse counter 73 increments its count value one by one at times corresponding to the release of the forcing shutoff state.

When the fuse counter 73 has overflowed, it terminates the count and outputs an active second forcing shutoff signal F so that the power MOSFET 14 is turned OFF. Thus a second forcing shutoff operation is performed, and the forcing shutoff state is thereafter maintained. That is, the forcing shutoff state is not released as far as the control signal S6 is active.

Thereafter, if the control signal S6 turns from active to nonactive, the clear counter 72 starts the count. When the clear counter 72 has overflowed, generation of the internal ground GND2 is terminated so that the power supply controller 10 completely turns off. This will be described in more detail in the following explanation made with reference to FIG. 10.

(Operation During Fuse Current Occurrence)

If short-circuiting occurs, for example, in a part of the electric wire 30, the load current IL may exceed the second anomaly threshold current ILfc as shown in FIG. 10.

At this time, the fuse current signal FC turns to active, so that the output signal FCM of the FC memory 78 turns from high to low level and the FR counter 71 is reset. Thereby the first anomaly threshold current ILoc, which has been decreased stepwise, is restored to the initial level, and thereafter decreased again with time according to the count value of the FR counter 71.

An active count signal OvF7 is outputted 16 milliseconds later than the reset of the FR counter 71 and, in response to this, the fuse counter 73 increments its count value by one (See [FCC] field in FIG. 10).

If the short-circuiting in the electric wire 30 is thereafter not eliminated, the clear counter 72 does not start the count, and the FR counter 71 repeats the count and overflow without being reset. The fuse counter 73 increments its count value one by one at times corresponding to the overflow of the FR counter 71 (in 16 millisecond periods in the present embodiment).

When the count value [FCC] of the fuse counter 73 reaches eight, the OC threshold designation generator 93 thereafter keeps outputting an active threshold designation signal OCL5 so that the first anomaly threshold current ILoc is maintained to the lowest level.

When the fuse counter 73 has overflowed, it terminates the count and outputs an active second forcing shutoff signal F so that the power MOSFET 14 is turned OFF. Thus a second forcing shutoff operation is performed, and the forcing shutoff state is thereafter maintained.

Thereafter, if the control signal S6 turns from active to nonactive as shown in FIG. 10, the reset state of the clear counter 72 is released. The clear counter 72 starts the count, but continues to output a nonactive clear signal CLR so that generation of the internal ground GND2 is maintained.

When the clear counter 72 has overflowed (512 milliseconds later in the present embodiment), it outputs an active clear signal CLR so that the generation of the internal ground GND2 is terminated. Even if the control signal S6 returns to active before the clear counter 72 overflows (i.e., while counting), the second forcing shutoff state is maintained (i.e., the power MOSFET 14 is not turned ON).

On the other hand, if the short-circuiting in the electric wire 30 is eliminated without a second forcing shutoff operation being performed (i.e., without the fuse counter 73 overflowing, or while counting), the reset state of the clear counter 72 is released at the time. Then the clear counter 72 starts the count, and increments its count value one by one at times corresponding to down edges of the count signal OvF7.

When the clear counter 72 has overflowed (512 milliseconds later in the present embodiment), it outputs an active clear signal CLR and, in response to this, the fuse counter 73 is reset to "0". Thereafter the power supply controller 10 may operate as shown in FIG. 8, if the normal state is maintained.

In the case that short-circuiting occurs in some of stranded wires constituting the electric wire 30, an abnormal current appears only in the short-circuiting stranded wires. This could result in a chattering short.

That is, a fuse current, which is larger than the second anomaly threshold current ILfc and of a shorter duration than the reference FUSE time (1024 milliseconds in the present embodiment), may be detected repeatedly and intermittently at intervals shorter than the reference NORMAL duration (512 milliseconds in the present embodiment).

In this case, the clear counter 72 starts the count and the fuse counter 73 suspends the count, when the load current IL falls below the second anomaly threshold current ILfc. However, the load current IL thereafter exceeds the second anomaly threshold current ILfc again without the clear counter 72 reaching overflow, and then the fuse counter 73 resumes the count.

Thus the fuse counter 73 accumulates a time for a fuse current. When the fuse counter 73 overflows (i.e., the accumulated time reaches around the reference FUSE time), a second forcing shutoff operation is performed. This forcing shutoff state is maintained until the power supply controller 10 turns off.

In the present embodiment, the second anomaly threshold current ILfc is set to a level slightly higher than the rated current ILmax as described above. The reference FUSE time is set to a time shorter than the time taken for the electrical wire 30 to emit smoke when a current around the rated current ILmax passes through the electrical wire 30.

Therefore, in case of the above chattering short, the second forcing shutoff operation can be performed for the power MOSFET 14 sufficiently early, so that the electrical wire 30 does not reach smoke emission:

(Operation During Wire-Breaking Anomaly Occurrence)

If the third anomaly threshold current ILop is supposedly set to a constant value irrespective of the level of the power supply voltage Vcc, a threshold load resistance (i.e., a threshold resistance of the external circuit), on which a wire-breaking anomaly is detected, varies with the power supply voltage Vcc.

However, the threshold load resistance should be constant irrespective of the level of the power supply voltage Vcc in order to accurately detect a wire-breaking anomaly. Therefore, in the present embodiment, the third anomaly threshold current ILop (and therefore also the third anomaly threshold voltage Vop) vary in proportion to the source voltage Vs of the power MOSFET 14 in the ON state as described above. That is, the third anomaly threshold current ILop varies in proportion to the power supply voltage Vcc.

According to this construction, the third anomaly threshold current ILop decreases by half, if the power supply voltage Vcc decreases by half. That is, the threshold load resistance for wire-breaking anomaly detection is constant irrespective of the changes of the power supply voltage Vcc. Thereby a wire-breaking anomaly can be detected accurately without using a microcomputer or the like.

When the load current IL is smaller than the third anomaly threshold current ILop, indication of a wire-breaking anomaly is detected. If the indication lasts for a time of the reference NORMAL duration (512 milliseconds in the present embodiment) or more, the wire-breaking anomaly is determined.

(Operation During Short Anomaly Occurrence)

FIG. 11 is a table showing the gate-to-source voltage Vgs and the source voltage Vs of the power MOSFET 14 when the power MOSFET 14 is in various states.

If a power MOS short (i.e., short-circuiting between the drain and source of the power MOSFET 14) occurs, the source voltage Vs of the power MOSFET 14 during reception of a nonactive control signal (OFF signal) is approximately equal to the power supply voltage Vcc as shown in FIG. 11.

The first threshold voltage Vt1 is set to a level slightly higher than the drain-to-source voltage Vds of the power MOSFET 14 when a power MOS short has occurred, as described above. Therefore the drain-to-source voltage Vds of the power MOSFET 14 during reception of a nonactive control signal (OFF signal) is lower than the first threshold voltage Vt1, when a power MOS short has occurred. That is, the first determination circuit 121 outputs an active first determination signal S2 in this case.

In response to the active first determination signal S2, the short anomaly detecting circuit 123 outputs an output signal S5 of low level (i.e., a short anomaly signal). Thus the power MOS short is detected as a short anomaly of the power MOSFET 14.

If a drain-gate short occurs in the power MOSFET 14, the power MOSFET 14 is in a halfway ON state due to the drain-gate short even when the control signal is nonactive (i.e., when an OFF signal is received). That is, the gate-to-source voltage Vgs of the power MOSFET 14 is higher than the second threshold voltage Vt2 in this case as shown in FIG. 11.

Therefore the second determination circuit 150 outputs an active second determination signal S3. The short anomaly detecting circuit 123 outputs an output signal S5 of low level (i.e., a short anomaly signal) in response to the active second determination signal S3.

On the other hand, the source voltage Vs of the power MOSFET 14 during a drain-gate short occurrence is lower than the power supply voltage Vcc as shown in FIG. 11. That is, the drain-to-source voltage Vds of the power MOSFET 14 is higher than the first threshold voltage Vt1 in this case, and therefore the first determination circuit 121 outputs a nonactive first determination signal S2.

That is, when a drain-gate short has occurred, although the first determination circuit 121 outputs a nonactive first determination signal S2, the second determination circuit 150 outputs an active second determination signal S3. Thereby the drain-gate short is detected as a short anomaly of the power MOSFET 14.

If no short anomaly has occurred in the power MOSFET 14, the first determination circuit 121 outputs a nonactive first determination signal S2 and the second determination circuit 150 outputs a nonactive second determination signal S3 during reception of a nonactive control signal S6.

Particularly in the case that the load 11 is a motor, the source voltage Vs of the power MOSFET 14 is temporarily pulled to the negative side due to the surge voltage immediately after the control signal S6 turns to nonactive as described above.

Thereafter an electromotive force is generated due to the inertial rotation of the motor, and thereby the source voltage Vs of the power MOSFET 14 is increased to a higher level. However the source voltage Vs in this case is lower than that in case of a power MOS short occurrence as shown in FIG. 11.

That is, the drain-to-source voltage Vds is not lower than the first threshold voltage Vt1, and therefore the first determination circuit 120 outputs a nonactive first determination signal S2 during the electromotive force.

Further the gate-to-source voltage Vgs is lower than the second threshold voltage Vt2 during the electromotive force as shown in FIG. 11, because the power MOSFET 14 is OFF due to the nonactive control signal S6. That is, the second determination circuit 150 outputs a nonactive second determination signal S3 in this case.

Thus the first and second determination signals S2 and S3 are both nonactive, and therefore the short anomaly detecting circuit 123 outputs a nonactive output signal S5 during the electromotive force. Thus false detection due to the electromotive force of the motor can be prevented.

Moreover, the short anomaly detecting circuit 123 includes the FET 139 which turns on when a predetermined time (2 milliseconds in the present embodiment) has elapsed since the control signal S6 turns to nonactive, as described above. Thereby the short anomaly detecting circuit 123 can output an active output signal S5 two milliseconds or more later than the nonactive control signal S6.

That is, the short anomaly detecting circuit 123 outputs an active output signal S5, if it receives an active first determination signal S2 or an active second determination signal S3 two milliseconds or more later than the nonactive control signal S6. According to this construction, false detection can be prevented when the source voltage Vs of the power MOSFET 14 is still decreasing immediately after the nonactive control signal S6.

In the case that the load 11 is a motor, the predetermined time may be set to a larger value than the above (2 milliseconds), so that a short anomaly can be determined after the source voltage Vs variation due to noises enhanced by an electromotive force of the motor almost settles down.

Thus, the power supply controller 10 according to the present embodiment can detect a short anomaly such as a power MOS short or a drain-gate short, thereby preventing false detection due to an electromotive force of the motor.

Second Embodiment

Next, a second embodiment of the present invention will be explained with reference to FIGS. 12 and 13.

In the first embodiment shown in FIGS. 1 through 11, whether the power MOSFET 14 is in an ON state or not is determined based on the gate-to-source voltage Vgs of the power MOSFET 14. In contrast, according to the present embodiment, whether the power MOSFET 14 is in an ON state or not is determined based on the source voltage Vs' of the sense MOSFET 18.

The other constructions of the present embodiment are similar to the first embodiment. Therefore the same components as the first embodiment are designated by the same symbols, and redundant explanation is omitted. The difference from the first embodiment is as follows.

Figure 12:
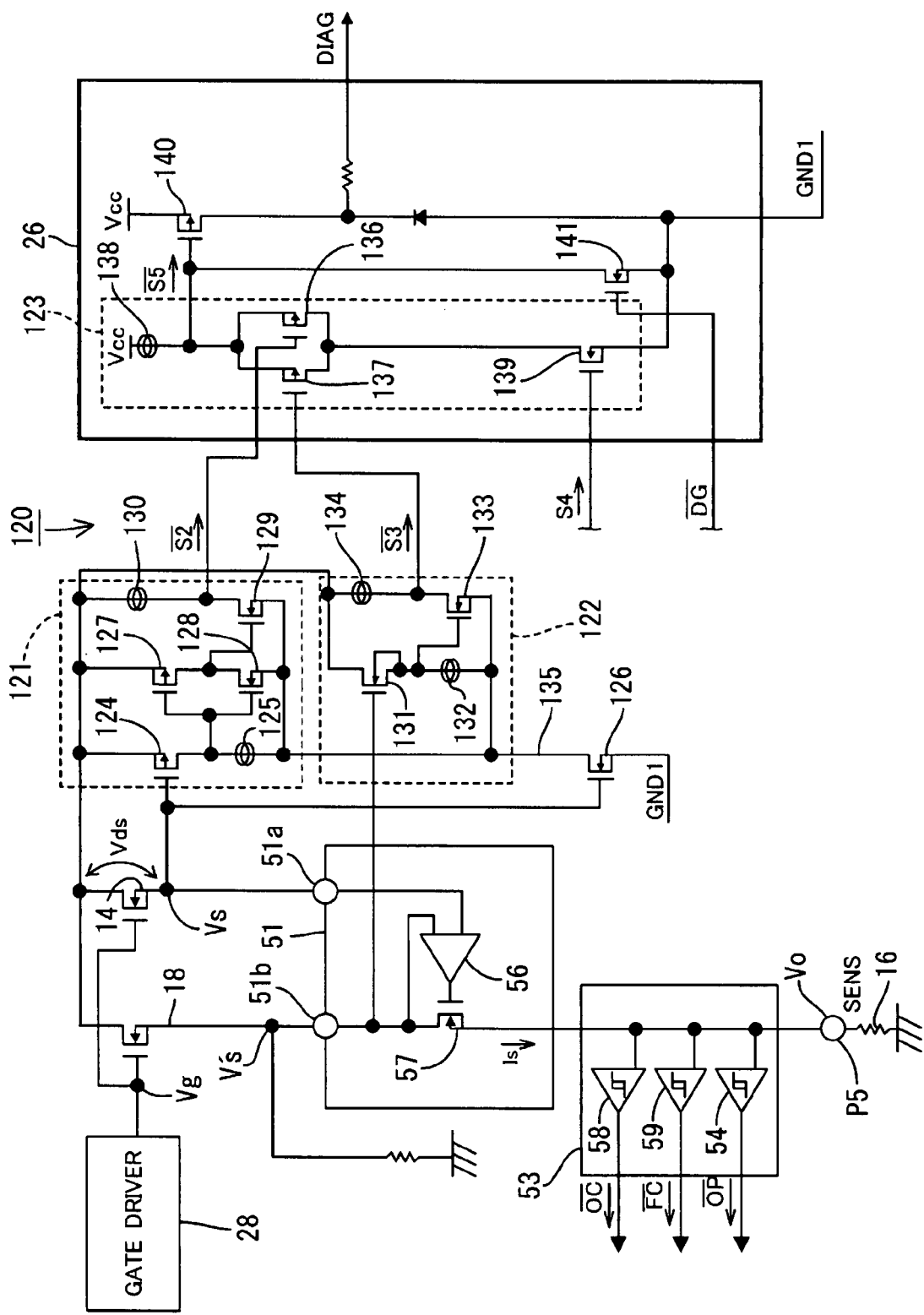
FIG. 12 is a circuit diagram showing a short failure detector according to a second embodiment of the present invention.

According to the present embodiment, a second determination circuit 122 determines whether the power MOSFET 14 is in the ON state or not based on the source voltage Vs' of the sense MOSFET 18 as shown in FIG. 12. The source voltage Vs' of the sense MOSFET 18 is an example of an output terminal voltage of the current detecting switching element of the present invention.

Specifically, the second determination circuit 122 includes an FET 131, which turns on when the source voltage Vs' of the sense MOSFET 18 exceeds the threshold voltage Vt3 (hereinafter referred to as a third threshold voltage) of the FET 131. The third threshold voltage Vt3 is an example of a third threshold of the present invention.

The FET 131 is of n-channel type, and the drain thereof is connected in common to the drains of the power MOSFET 14 and sense MOSFET 18. The gate of the FET 131 is connected to the source of the sense MOSFET 18, and the source of the FET 131 is connected to the resistor 37 (shown in FIG. 1) via a constant current circuit 132 and the above-described FET 126.

The second determination circuit 122 further includes an FET 133, which turns on if the FET 131 turns on. The FET 133 is of n-channel type, and the drain thereof is connected to the drain of the FET 131 via a constant current circuit 134. The gate of the FET 133 is connected to the source of the FET 131, and the source of the FET 133 is connected to the downstream side of the constant current circuit 132.

According to this construction, when the source voltage Vs' of the sense MOSFET 18 exceeds the third threshold voltage Vt3, the FET 133 turns on and thereby the second determination circuit 122 outputs a second determination signal S3 of low level (low active signal).

The third threshold voltage Vt3 is set to a level slightly lower than the source voltage Vs' of the sense MOSFET 18 when a drain-gate short has occurred and the control signal S6 is nonactive. A second determination signal S3 of the present embodiment is an example of a second signal of the present invention.

FIG. 13 is a table showing the source voltages Vs and Vs' of the power MOSFET 14 and the sense MOSFET 18 when the power MOSFET 14 is in various states.

When a drain-gate short has occurred in the power MOSFET 14, the gate voltage Vg of the sense MOSFET 18 during a nonactive control signal S6 is increased due to the drain-gate short, so that the sense MOSFET 18 is in a halfway ON state. That is, the source voltage Vs' of the sense MOSFET 18 exceeds the third threshold voltage Vt3 in this case.

Thereby the second determination circuit 122 outputs an active second determination signal S3, and the short anomaly detecting circuit 123 outputs an output signal S5 of low level (i.e., a short anomaly signal) in response to the active second determination signal S3. Thus the drain-gate short can be detected.

When a power MOS short has occurred, the source voltage Vs' of the sense MOSFET 18 is lower than the third threshold voltage Vt3 as shown in FIG. 13. However, the drain-to-source voltage Vds of the power MOSFET 14 is lower than the first threshold voltage Vt1, and therefore the first determination circuit 121 outputs an active first determination signal S2. Thus the power MOS short can be detected.

When no short anomaly has occurred, the first and second determination signals S2 and S3 are both nonactive, and therefore the short anomaly detecting circuit 123 outputs a nonactive output signal S5.

Particularly in the case that the load 11 is a motor, an electromotive force is generated due to the inertial rotation of the motor after the control signal S6 turns to nonactive. Thereby the source voltage Vs of the power MOSFET 14 is increased to a higher level.

However the source voltage Vs in this case is lower than that in case of a power MOS short occurrence. That is, the drain-to-source voltage Vds is not lower than the first threshold voltage Vt1, and therefore the first determination circuit 120 outputs a nonactive first determination signal S2.

Further the source voltage Vs' of the sense MOSFET 18 is lower than the third threshold voltage Vt3 during the electromotive force, because the sense MOSFET 18 is OFF due to the nonactive control signal S6. That is, the second determination circuit 122 outputs a nonactive second determination signal S3 in this case. The first and second determination signals S2 and S3 are both nonactive, and therefore the short anomaly detecting circuit 123 outputs a nonactive output signal S5 during the electromotive force.

Thus, the power supply controller according to the present embodiment can detect a short anomaly of the power MOSFET 14, preventing false detection due to an electromotive force of the motor.

MODIFICATIONS

In the foregoing description and illustration of this invention, two specific embodiments thereof have been disclosed in detail. Several changes and modifications will be apparent to those skilled in the art which do not depart from the essential concept of this invention and accordingly, it is intended that the appended claims cover all such changes and modifications as fall within the true spirit and scope of this invention.

(1) In the above embodiments, the power MOSFET 14 is included as a semiconductor switching element. However the present invention is not limited to this construction, but a unipolar transistor other than a MOSFET or alternatively a bipolar transistor may be included as a semiconductor switching element.

(2) In the above embodiments, the sense MOSFET 18 is used as a current detecting switching element. That is, the load current IL is detected by a sensing method. However the present invention is not limited to this construction, but the load current IL may be detected by a shunt method, for example. According to the shunt method, a shunt resistor is provided on the current supply line, and the load current IL is detected based on the voltage drop of the shunt resistor.

(3) In the above embodiments, various current anomalies are detected by voltage comparison. However the present invention is not limited to this construction, but the current anomalies may be detected by current comparison.

The construction for current comparison is as follows, for example. Three FETs are provided instead of the comparators 54, 59, 58 of the above embodiments. The output side of the source potential controller 51 (i.e., the output of the sense current Is) is connected to the input sides (e.g., drains in the case of n-channel type FETs) of the FETs.

Each FET is configured so as to allow passage of the threshold current corresponding to the threshold voltage Voc, Vfc or Vop when the threshold voltage Voc, Vfc or Vop is applied to the gate thereof. According to this construction, a current as an anomaly signal can be outputted from the connecting point between the input side of the FET and the output side of the source potential controller 51, when the sense current Is is higher or lower than the threshold current.

(4) In the above embodiments, a voltage divider circuit including threshold setting resistors 64a-64c is used as a threshold changing circuit. However the present invention is not limited to this construction, but can be any construction in which the threshold values for fuse current and wire-breaking anomaly detection vary depending on the output-side voltage (e.g., the source voltage in the case of a MOSFET) of the semiconductor switching element.

For example, threshold setting switching elements are provided instead of the threshold setting resistors 64a-64c of the above embodiments, and the output-side voltage of the semiconductor switching element (e.g. a power MOSFET) is applied to the control terminals of the threshold setting switching elements.

According to this construction, a current corresponding to the output-side voltage of the semiconductor switching element can pass through the threshold setting switching element. This current can be used as a threshold current.

Further, resistors may be additionally provided so that the currents from the threshold setting switching elements pass through the resistors, respectively. In this case, the terminal voltage of each of the resistors may be used as a threshold voltage.

What is claimed is:

1. A power supply controller comprising:
a semiconductor switching element disposed on a current supply line from a power source to a load;
a control circuit configured to receive an ON signal and an OFF signal, and further configured to turn ON said semiconductor switching element based on reception of said ON signal and turn OFF said semiconductor switching element based on reception of said OFF signal;
a first determination circuit configured to output a first signal if an input-to-output voltage of said semiconductor switching element is smaller than a first threshold;
a second determination circuit configured to output a second signal if a control-to-output voltage of said semiconductor switching element is equal to or larger than a second threshold; and
a short detecting circuit configured to output a short anomaly signal indicating a short anomaly of said semiconductor switching element if at least one of said first signal from said first determination circuit and said second signal from said second determination circuit is outputted during reception of said OFF signal.

2. A power supply controller as in claim 1, wherein said second determination circuit is configured to output said second signal if a result of subtraction of an output terminal voltage of said semiconductor switching element from a control terminal voltage of said semiconductor switching element is equal to or larger than the second threshold.

3. A power supply controller as in claim 1 further comprising a current detecting switching element, wherein:
input sides of said semiconductor switching element and said current detecting switching element are connected to each other, and control terminals of said semiconductor switching element and said current detecting switching element are connected to each other;
said control circuit is configured to turn ON said semiconductor switching element and said current detecting switching element based on reception of said ON signal, and turn OFF said semiconductor switching element and said current detecting switching element based on reception of said OFF signal.

4. A power supply controller as in claim 1, wherein:
a leakage current block circuit is provided on a current path along which a current passes from said power source to said first determination circuit and said second determination circuit; and
said leakage current block circuit is configured to block passage of said current when an output terminal voltage of said semiconductor switching element is equal to or smaller than a third threshold, and further configured to allow passage of said current when the output terminal voltage is larger than said third threshold.

5. A power supply controller as in claim 2, wherein:
a leakage current block circuit is provided on a current path along which a current passes from said power source to said first determination circuit and said second determination circuit; and
said leakage current block circuit is configured to block passage of said current when an output terminal voltage of said semiconductor switching element is equal to or smaller than a third threshold, and further configured to allow passage of said current when the output terminal voltage is larger than said third threshold.

6. A power supply controller as in claim 3, wherein:
a leakage current block circuit is provided on a current path along which a current passes from said power source to said first determination circuit and said second determination circuit; and
said leakage current block circuit is configured to block passage of said current when an output terminal voltage of said semiconductor switching element is equal to or smaller than a third threshold, and further configured to allow passage of said current when the output terminal voltage is larger than said third threshold.

7. A power supply controller as in claim 1, wherein said short detecting circuit is configured to output said short anomaly signal if at least one of said first signal from said first determination circuit and said second signal from said second determination circuit is outputted when a predetermined time has elapsed since reception of said OFF signal.

8. A power supply controller as in claim 2, wherein said short detecting circuit is configured to output said short anomaly signal if at least one of said first signal from said first determination circuit and said second signal from said second determination circuit is outputted when a predetermined time has elapsed since reception of said OFF signal.

9. A power supply controller as in claim 3, wherein said short detecting circuit is configured to output said short anomaly signal if at least one of said first signal from said first determination circuit and said second signal from said second determination circuit is outputted when a predetermined time has elapsed since reception of said OFF signal.

10. A power supply controller as in claim 4, wherein said short detecting circuit is configured to output said short anomaly signal if at least one of said first, signal from said first determination circuit and said second signal from said second determination circuit is outputted when a predetermined time has elapsed since reception of said OFF signal.

11. A power supply controller comprising a semiconductor switching element disposed on a current supply line from a power source to a load, said semiconductor switching element being switched between ON and OFF for controlling power supply to said load,
wherein a short anomaly of said semiconductor switching element is determined if at least one of an input-to-output voltage of said semiconductor switching element being smaller than a first threshold and a control-to-output voltage of said semiconductor switching element being equal to or larger than a second threshold is determined, when an OFF signal for instruction to turn OFF said semiconductor switching element is received.

* * * * *